United States Patent
Yuzurihara et al.

(10) Patent No.: US 9,070,537 B2
(45) Date of Patent: Jun. 30, 2015

(54) HIGH-FREQUENCY POWER SUPPLY DEVICE AND REFLECTED WAVE POWER CONTROL METHOD

(71) Applicant: KYOSAN ELECTRIC MFG. CO., LTD., Yokohama-shi, Kanagawa (JP)

(72) Inventors: Itsuo Yuzurihara, Zama (JP); Satoshi Aikawa, Yokohama (JP); Hiroshi Kunitama, Tokyo (JP)

(73) Assignee: KYOSAN ELECTRIC MFG. CO., LTD., Kanagawa (JP)

( * ) Notice: Subject to any disclaimer, the term of this patent is extended or adjusted under 35 U.S.C. 154(b) by 0 days.

(21) Appl. No.: 14/394,341

(22) PCT Filed: Jun. 3, 2013

(86) PCT No.: PCT/JP2013/065339
§ 371 (c)(1),
(2) Date: Oct. 14, 2014

(87) PCT Pub. No.: WO2013/190987
PCT Pub. Date: Dec. 27, 2013

(65) Prior Publication Data
US 2015/0084509 A1 Mar. 26, 2015

(30) Foreign Application Priority Data
Jun. 18, 2012 (JP) ................................. 2012-136942

(51) Int. Cl.
*H01J 37/32* (2006.01)
*H05H 1/46* (2006.01)
(Continued)

(52) U.S. Cl.
CPC ............ *H01J 37/32174* (2013.01); *H05H 1/46* (2013.01); *H01J 37/32082* (2013.01);
(Continued)

(58) Field of Classification Search
CPC ..................... H01J 37/32147; H01J 37/32146
USPC ........................................... 315/111.21, 307
See application file for complete search history.

(56) References Cited

U.S. PATENT DOCUMENTS

| 5,195,045 A | * 3/1993 | Keane et al. ................... 702/107 |
| 2010/0187998 A1 | 7/2010 | Yuzurihara et al. |
| 2011/0032047 A1 | 2/2011 | Yuzurihara et al. |

FOREIGN PATENT DOCUMENTS

| JP | 07-032078 B2 | 4/1995 |
| JP | 10-257774 A | 9/1998 |

(Continued)

OTHER PUBLICATIONS

Notification of Transmittal of Translation of the International Preliminary Report on Patentability (Form PCT/IB/326) of International Application No. PCT/JP2013/065339 mailed Dec. 31, 2014 with Forms PCT/IB/373, PCT/IB/338 and PCT/ISA/237 with English Translation.

(Continued)

*Primary Examiner* — Don Le
(74) *Attorney, Agent, or Firm* — Westerman, Hattori, Daniels & Adrian, LLP

(57) ABSTRACT

In an RF power supply for supplying RF power to a plasma load, reflected wave power control is performed in which the reflected wave power of an RF generator is detected and the RF generator is controlled. For a short-time variation in reflected wave power, control is performed based on a peak value variation in the detection value of reflected wave power. For a long-time variation in reflected wave power, control is performed based on a variation in a smoothed value obtained by smoothing detection values of reflected wave power. A reflected wave power control loop system includes a reflected wave power peak value dropping loop system and an arc blocking system that perform control based on a peak variation in reflected wave power and a reflected wave power amount dropping loop system that performs control based on a smoothed power amount of reflected wave power.

12 Claims, 20 Drawing Sheets

(51) Int. Cl.
*H02M 1/08* (2006.01)
*H02M 7/539* (2006.01)

(52) U.S. Cl.
CPC ..... *H01J 37/32183* (2013.01); *H01J 37/32944* (2013.01); *H01J 37/3299* (2013.01); *H05H 2001/4682* (2013.01); *H01J 37/32146* (2013.01); *H02M 1/08* (2013.01); *H02M 7/539* (2013.01)

(56) References Cited

FOREIGN PATENT DOCUMENTS

| | | |
|---|---|---|
| JP | 2003-218655 A | 7/2003 |
| JP | 2004-008893 A | 1/2004 |
| JP | 2004-071269 A | 3/2004 |
| JP | 3641785 B2 | 4/2005 |
| JP | 2005-136933 A | 5/2005 |
| JP | 2005-204405 A | 7/2005 |
| JP | 3893276 B2 | 3/2007 |
| JP | 3998986 B2 | 10/2007 |
| WO | 2009/118920 A1 | 10/2009 |
| WO | 2011/016266 A1 | 2/2011 |
| WO | 2011/125733 A1 | 10/2011 |

OTHER PUBLICATIONS

International Search Report dated Sep. 3, 2013, issued in corresponding application No. PCT/JP2013/065339.

Written Opinion dated Sep. 3, 2013, issued in corresponding application No. PCT/JP2013/065339, w/English translation.

* cited by examiner

RF GATE SIGNAL A, $\overline{B}$

RF GATE SIGNAL $\overline{A}$, B

PULSE CONTROL SIGNAL

RF OUTPUT

FORWARD WAVE POWER

REFLECTED WAVE POWER

FIG. 13A
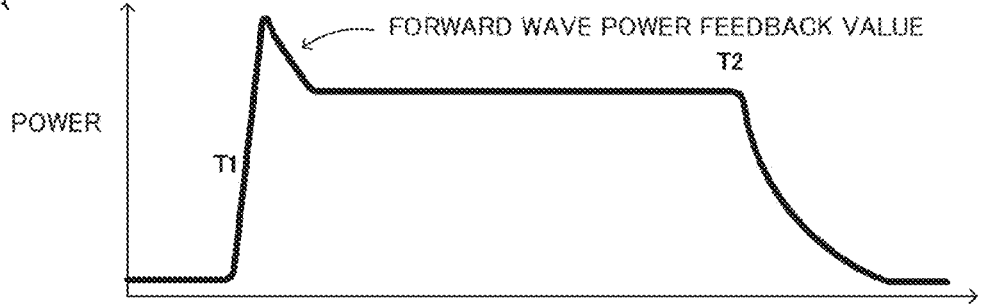
FIG. 13B
FIG. 13C
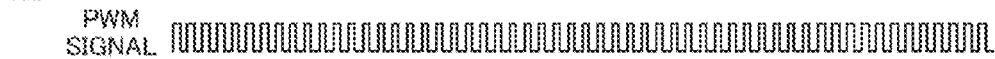
FIG. 13D
FIG. 13E
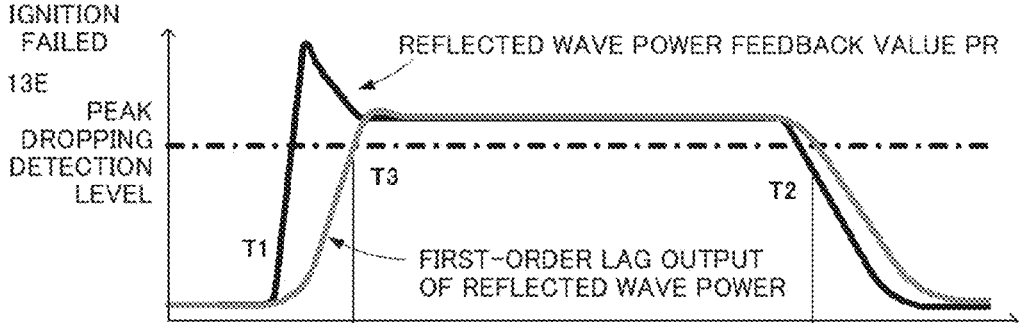
FIG. 13F
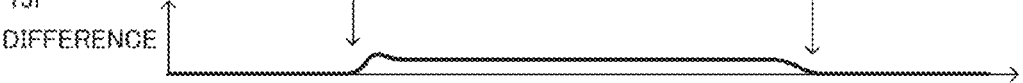
FIG. 13G
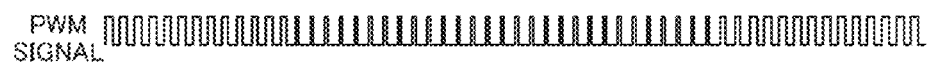

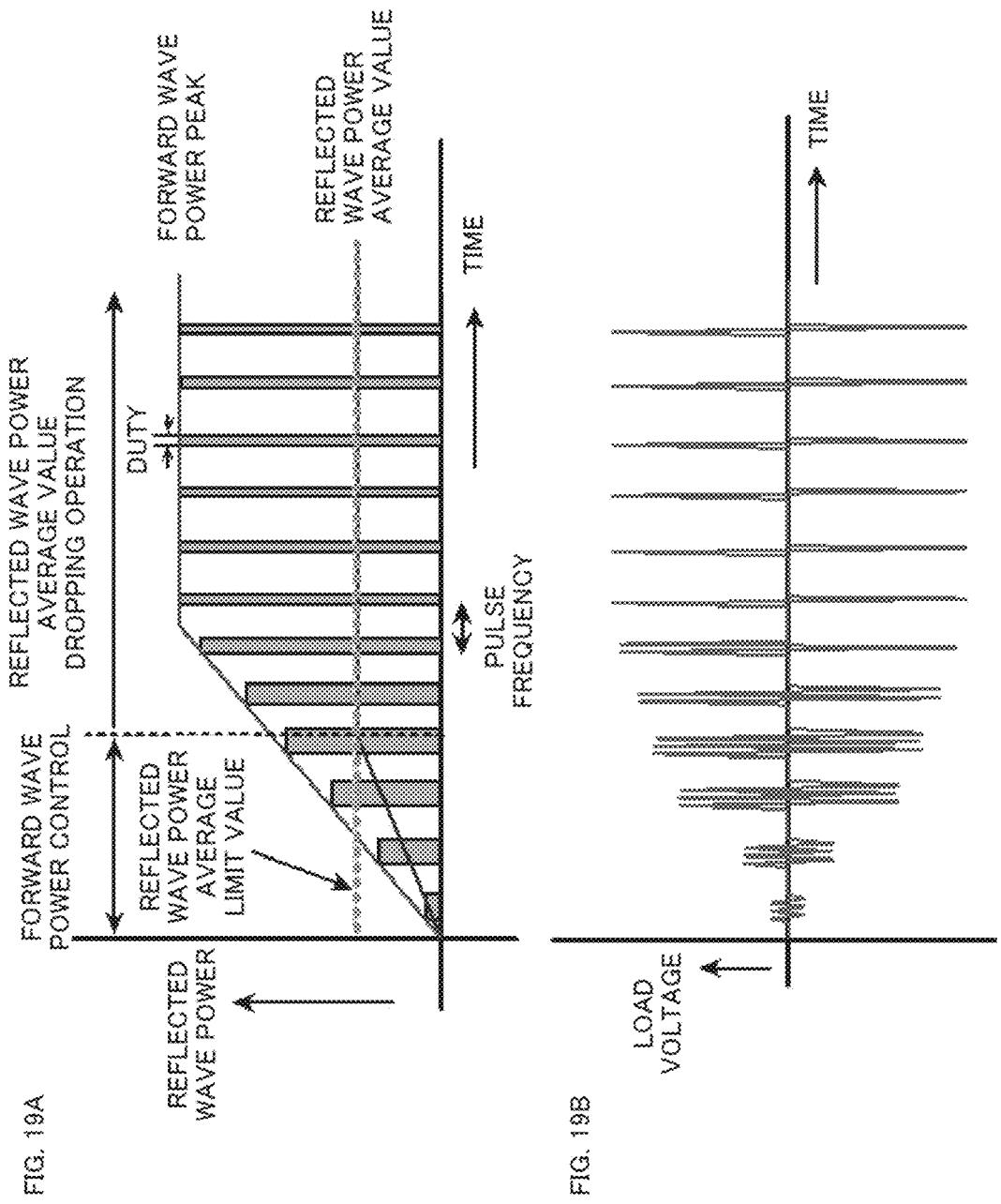

HIGH-FREQUENCY POWER SUPPLY DEVICE AND REFLECTED WAVE POWER CONTROL METHOD

TECHNICAL FIELD

The present invention relates to a reflected wave power control method and an RF power supplying device for controlling reflected wave power that is transmitted from a load side to an RF generator side when RF power is supplied from the RF generator to the load.

BACKGROUND ART

An RF generator that converts the DC of a DC power supply to RF AC through the switching operation is known. As this RF generator, a class-D RF generator using a class-D amplifier circuit (Class D: IEC International Standard IEC 60268-3 4 classes of operation) is known.

A class-D RF generator causes the RF power amplifier device to perform the switching operation via the RF gate signal, which has a predetermined duty ratio, to convert the DC of a DC power supply to RF AC and supplies the obtained RF AC to a load as RF forward wave power. The class-D RF generator adjusts the output through the pulse operation. The pulse operation is performed in a driving mode in which ON state and the OFF state are alternated by the RF gate signal. In the ON state, the switching operation is performed by the RF power amplifier device and RF power is output; in the OFF state, the switching operation is not performed and RF power is not output. The RF output power is adjusted by changing the duty ratio that is a time ratio between the ON state and the OFF state. The duty ratio between the ON state and the OFF state can be controlled by a duty ratio between the ON state and the OFF state of the pulse control signal. In this specification, RF means high frequency.

When RF power is supplied from an RF power generator to a load, for example, to a load such as a plasma treatment device, the load impedance varies according to the state of a plasma discharge. When the load impedance varies, reflected wave power that returns from the load side to the RF generator side varies.

In some cases, reflected wave power affects a class-D RF generator. For example, an RF power amplifier device, which is one of the components of a class-D RF generator, may suffer thermal damage due to heat generated by an internal loss caused by reflected wave power or may suffer insulation damage due to a surge voltage of reflected wave power. A still larger reflected wave power sometimes damages the DC power supply that is one of the components of a class-D RF generator.

In particular, when a class-D RF generator supplies RF power to a plasma load through the pulse operation, forward wave power all returns to the generator side as reflected wave power in the non-ignition state in which plasma is not yet ignited. Therefore, a class-D RF generator is required to tolerate total reflected wave power. In the description below, reflected wave power generated when forward wave power all returns to the generator side is called total reflected wave power, and the ability to tolerate total reflected wave power during RF power supply is called total reflected wave power tolerance.

The total reflected wave power tolerance includes the ability not only to prevent an RF power amplifier device from being damaged by total reflected wave power but also to continue the plasma ignition operation by continuously supplying power without interruption from the time the ignition operation is started to the time the supply of RF power is stopped upon determination that the ignition has failed.

Conventionally, to realize such total reflected wave power tolerance, the present applicant has proposed a plasma generation power supply (see Patent Literature 1). Patent Literature 1 describes a technology that uses load impedance, viewed from an RF power amplifier device, in the delay state in order to suppress accumulated carriers in the body diode of the RF power amplifier device and thereby reduces the switching loss of the circuit. To realize total reflected wave power tolerance, it is further required to limit the ignition time, necessary for the ignition operation at plasma ignition time, in advance and, by doing so, to limit the reflected wave power within this ignition time to the same power level as that of the rated power of forward wave power.

Not only a class-D RF generator, a class-C RF generator is also known as a RF generator that is usually used. For use by a usually used RF generator device such as a class-C RF generator, a technology is known that reduces forward wave power on the supplying side in order to reduce the supply of reflected wave power to a level equal to or lower than the rated output when reflected wave power is generated. In this way, the technology prevents the device on the RF generator side from being damaged (Patent Literature 2 to Patent Literature 7).

Patent Literatures 2 and 3 disclose technologies for stopping the supply of power, and Patent Literatures 4 to 7 disclose technologies for reducing forward wave power.

Patent literature 2 describes a shutdown method for controlling the forward wave power value of an RF plasma power supply so that the reflected wave power value becomes equal to or lower than 10% to 20% of the rated output. Patent literature 3 describes a microwave power supply system that uses a signal, output from a reflected wave power detector, to temporally integrate the differences between the magnitude of the signal, corresponding to the reflected microwave power, and the charge/discharge reference value and, if the magnitude of the integrated signal having the magnitude corresponding to the integrated value exceeds the allowable reference value, shuts down the supply of power.

Patent literature 4 describes a technology that reduces the output power using a mixer when reflected wave power exceeds the limit value. Patent literature 5 describes a technology that generates a power control signal using the power reduction signal, output from the reflected wave power detection signal, and forward wave power. Patent literature 6 describes a technology that calculates the difference between the reflected wave power, which is detected and fed back, and the reflected wave power that is set and, based on the calculated difference, drops the forward wave power. Patent literature 7 describes a technology that calculates a reflected wave coefficient based on the reflected wave power, corrects the magnitude of the gain of the attenuator according to the calculated reflected wave coefficient, and supplies required power to the load.

Patent literature 8 describes a technology that differentiates the output of the sensor, which measures reflected wave power, and determines the generation of an abnormal discharge based on the degree of temporal variations in the reflected wave of RF power output by the differentiation.

CITATION LIST

Patent Literatures

Patent Literature 1: Japanese Patent No. 3641785 (paragraph [0046], paragraph [0047])

Patent Literature 2: Japanese Patent Publication No. 7-32078 (paragraph [0003], paragraph [0005])
Patent Literature 3: Japanese Patent Application Publication No. 2004-71269 (paragraph [0017], paragraph [0018])
Patent Literature 4: Japanese Patent Application Publication No. 10-257774 (paragraph [0028]-paragraph [0031])
Patent Literature 5: Japanese Patent No. 3998986 (paragraph [0028])
Patent Literature 6: Japanese Patent Application Publication No. 2004-8893 (paragraph [0019])
Patent Literature 7: Japanese Patent Application Publication No. 2005-136933 (paragraph [0013])
Patent Literature 8: Japanese Patent No. 3893276 (paragraph [0008], paragraph [0025])

SUMMARY OF THE INVENTION

Technical Problem

When a class-D RF generator supplies RF power to a plasma load through the pulse operation, it is required, in the non-ignition state before plasma is ignited, to supply a high load-end power to the load against total reflected wave power, generated when forward wave power all returns to the generator side as reflected wave power and, thereby, to increase plasma ignition ability during the pulse operation, with no damage to the RF power amplifier device caused by total reflected wave power at pulse operation time.

According to the technology described in Patent Literature 1, the load impedance is used in the delay state to reduce the switching loss of the circuit. However, when the plasma ignition time is limited to realize total reflected wave power tolerance, plasma may remain un-ignited if it takes long until plasma is ignited.

According to the technology described in Patent Literatures 2 and 3, the power supply is stopped. The technology described in Patent Literature 2 controls forward wave power so that the reflected wave power value becomes equal to or lower than 10%-20% of the rated output. The technology described in Patent Literature 3 controls power shutdown based on the output of the charge/discharge circuit. These technologies cannot maintain the supply of RF power while tolerating total reflected wave power, meaning that total reflected wave power tolerance cannot be realized.

Even if the RF generator and the plasma load match properly when the DC of the DC power supply is converted to RF AC via the switching operation in the RF generator and the forward wave power of RF power is supplied to the plasma load, the load impedance of the plasma load varies largely at plasma rise time. This variation in the load impedance generates reflected wave power that returns from the plasma load side to the generator side. The reflected wave power generated at plasma rise-time varies largely in a short time.

According to the power control described in Patent Literature 4 to Patent Literature 7, the power is controlled based on the instantaneous value of reflected wave power. Therefore, when reflected wave power rises rapidly at plasma rise time and its peak value exceeds the setting value, power reduction is started by power control. When the power supplied to the plasma load is limited by power control, the supplied power is limited before plasma is ignited with the result that plasma is not ignited successfully. Even if plasma is ignited successfully, the problem is that the reduced power supply makes it difficult to maintain plasma, meaning that normal plasma generation is difficult.

That is, the conventional power control reduces power based on an instantaneous value of reflected wave power. This may result in an incorrect determination that the peak of reflected wave power at plasma rise time is mistaken as an increase in reflected wave power caused by a plasma state change that will exist for a long time. If the power is turned off or reduced based on this incorrect determination, it becomes difficult to ignite or maintain plasma.

Therefore, in an RF generator that supplies RF power to a plasma load through the pulse operation, it is an object of the present invention, in the non-ignition state before plasma is ignited, to solve the above-described conventional problems with total reflected wave power tolerance that is the ability to tolerate total reflected wave power generated when forward wave power all returns to the generator side as reflected wave power. More specifically, when a class-D RF generator supplies RF power to a plasma load through the pulse operation, an object of the present invention is to realize total reflected wave power tolerance that is the ability to tolerate total reflected wave power generated when forward wave power all returns to the generator side as reflected wave power in the non-ignition state before plasma is ignited, to prevent an RF power amplifier device from being damaged by all reflected wave power during the pulse operation and, at the same time, to continue the plasma ignition operation by continuously supplying power without shutting down the supply of RF power in order to increase the plasma ignition performance during the pulse operation time.

Solution to Problem

In an RF power supply for supplying RF power to a plasma load, the present invention relates to reflected wave power control in which the reflected wave power of an RF generator is detected and, using the detected reflected wave power, the RF generator is controlled. For a short-time variation in reflected wave power, reflected wave power is controlled based on a variation in the peak value of the detection value of reflected wave power. For a long-time variation in reflected wave power, reflected wave power is controlled based on a variation in a smoothed value obtained by smoothing detection values of reflected wave power.

According to the present invention, a reflected wave power control loop system includes a reflected wave power peak value dropping loop system and an arc blocking system that perform control based on a peak variation in reflected wave power and a reflected wave power amount dropping loop system that performs control based on a smoothed power amount of reflected wave power.

The reflected wave power peak value dropping loop system of the present invention controls the DC voltage of the DC power supply of the RF generator unit based on the peak value of reflected wave power and, through the voltage control of the DC power supply, performs dropping control of the peak value of reflected wave power. The reflected wave power peak value dropping loop system is a control system that drops (reduces) the peak value of reflected wave power when the peak value of reflected wave power exceeds a setting value (reflected wave power peak limit value). This system drops (reduces) the amplitude of the peak value of reflected wave power to prevent the RF power amplifier device from being destroyed due to an overload or a surge voltage.

The reflected wave power peak value dropping loop system is configured to control the DC voltage of the DC power supply of the RF generator unit. The system feeds back the peak value of reflected wave power to this DC power supply to cause it to drop the DC voltage, thus speedily dropping the peak value of reflected wave power.

The arc blocking system of the present invention controls whether to output from the RF amplifier unit of the RF generator unit based on the peak value of reflected wave power and thereby controls whether to supply power to the plasma load to control the blocking of an arc at the plasma load. The arc blocking system is a control system that stops the power supply when the peak value of reflected wave power exceeds the setting value (arc limit value). When the ignition fails and a high reflected wave power is generated that exceeds the arc blocking level at which that an arc at the plasma load is blocked, the arc blocking system stops the power supply to extinguish an arc in the plasma load. It is also possible to configure the system in such way that, when an arc is blocked, the ignition retry function, which performs the re-ignition operation after a predetermined time, is activated to ignite plasma again.

The reflected wave power peak value dropping loop system and the arc blocking system of the present invention perform the control to drop the peak value of reflected wave power or perform control to stop the power supply when the peak value of reflected wave power exceeds the setting value that is set in each control system.

At least one of the reflected wave power peak value dropping loop system and the arc blocking system of the present invention may include a sharp variation removing unit that removes a sharp variation from the detection value of reflected wave power. The sharp variation removing unit removes a sharp variation amount, generated by a sharp variation, from the detection value of reflected wave power, and feeds back a signal corresponding to the peak value of reflected wave power not generated by the sharp variation and existing longer than the sharp variation. The use of the peak value, from which a sharp variation amount is removed, prevents an incorrect determination that could be generated by the feedback control based on a peak value caused by a sharp variation generated at a plasma rise time. The sharp variation removing unit may be configured by a first-order lag circuit such as a low pass filter.

The reflected wave power amount dropping loop system of the present invention controls the amplification of the RF amplifier unit of the RF generator unit, based on the smoothed power amount of reflected wave power, to control the amount of power to be supplied to the plasma load for controlling whether to drop the smoothed power amount of reflected wave power. The reflected wave power amount dropping loop system is a control system that drops (reduces) the power amount of reflected wave power when the smoothed value, such as the average value or the effective value of the power amount of reflected wave power, exceeds the setting value (reflected wave power smoothed limit value). This system drops (reduces) the power amount of reflected wave power with the amplitude of the output voltage maintained, thus preventing thermal damage to the RF power amplifier device.

The control systems of the present invention, including the reflected wave power peak value dropping loop system, arc blocking system, and reflected wave power amount dropping loop system, can be each controlled independently. The setting values used for the control systems are the reflected wave power peak limit value, arc limit value, and reflected wave power smoothed limit value. The largest value is the arc limit value, the next largest value is the reflected wave power peak limit value, and the smallest value is the reflected wave power smoothed limit value.

The reflected wave power peak limit value is an index of effect on the RF amplifier device caused by an increase in the peak value of reflected wave power such as an overload or a surge voltage. When the peak value of reflected wave power exceeds this setting value, the reflected wave power peak value dropping loop system drops the peak value of reflected wave power and performs control so that the peak value of reflected wave power does not become equal to or larger than the setting value. The control based on this limit value protects the destruction of the RF power amplifier device from an overload or a surge voltage when reflected wave power is generated.

The arc limit value, which is a threshold for detecting an increase in reflected wave power generated by a failure in the ignition of the plasma load, is set as an arc blocking level. When the peak value of reflected wave power exceeds the arc blocking level, the arc blocking system determines that the ignition has failed and starts the arc blocking operation.

The reflected wave power smoothed limit value is a setting value used as an index of thermal effect on the RF power amplifier device caused by an increase in the power amount of reflected wave power. When the average value or the effective value of reflected wave power exceeds this setting value, the reflected wave power amount dropping loop system controls the duty ratio of the pulse control signal to control a drop (reduction) in the power amount of reflected wave power for preventing thermal damage to the RF power amplifier device. In the dropping control of the duty ratio, the reflected wave power amount dropping loop system reduces the ratio of the ON state in the time ratio between the ON state and the OFF state of the pulse control signal to reduce reflected wave power.

The reflected wave power control system of the present invention uses the reflected wave power peak value dropping loop system, arc blocking system, and reflected wave power amount dropping loop system described above to provide total reflected wave power tolerance, which is the ability to tolerate total reflected wave power generated when forward wave power all returns to the generator side as reflected wave power, in the non-ignition state before the plasma is ignited. Total reflected wave power tolerance, provided in this manner, prevents the RF power amplifier device from being damaged by total reflected wave power and, until reflected wave power generated due to an ignition failure becomes so high that the power supply must be stopped, continues supplying power without stopping the supply of RF power for continued plasma ignition operation, thus increasing the plasma ignition performance during the pulse operation.

One aspect of the present invention is an RF power supplying device and another aspect is a reflected wave power control method.

[Aspect of RF Power Supplying Device]

An RF power supplying device of the present invention, which is an RF power supplying device that supplies RF power to a plasma load, includes an RF generator unit that converts DC of a DC power supply to RF AC through a switching operation and outputs RF power; and a plurality of feedback systems that feeds back a detection value of the RF output of the RF generator unit for performing feedback control. The feedback system includes a forward wave power control loop system that feeds back a detection value of forward wave power, which is sent from the RF generator unit to a plasma load, for controlling the forward wave power; and a plurality of reflected wave power control loop systems each of which feeds back a detection value of reflected wave power, which is sent from the plasma load to the RF generator unit, for controlling the reflected wave power.

The arc blocking system does not form a control loop but, after performing the blocking processing to stop forward wave power, performs the plasma ignition operation through the re-ignition operation. Considering that this operation forms one type of loop, the arc blocking system is included in the reflected wave power control loop system in the description below.

In the feedback system of the reflected wave power control loop system, if a peak value generated at plasma rise time is determined incorrectly as a rise in reflected wave power caused by an abnormal condition of the plasma load, the feedback control will result in an incorrect operation.

To reduce this incorrect operation caused by a peak value, the reflected wave power peak value dropping loop system and the arc blocking system of the present invention include a sharp variation removing unit that removes a sharp variation from the detection value of reflected wave power detected at the output end of the RF generator unit.

The sharp variation removing unit, which may be configured by a first-order lag circuit, removes a sharp variation, included in the detection value, by causing a first-order lag in the detection value of reflected wave power. By causing a first-order lag in the detection value of reflected wave power, the first-order lag circuit can reduce a sharp variation included in reflected wave power generated at plasma rise time, prevent an incorrect determination caused by a variation that is not related to the plasma load and generated at plasma rise time, and thus prevent an incorrect operation that reduces the supply of RF power.

The sharp variation removing unit may be configured not only as a first-order lag circuit but also as a unit that detects a time at which the detection value of reflected wave power varies sharply and removes the detection value at this time.

The reflected wave power amount dropping loop system provided in the reflected wave power control loop system of the present invention, configured to calculate the smoothed value of reflected wave power, includes a power smoothing unit that outputs the average value or the effective value of the detection values of reflected wave power. As the criterion for determining whether the power amount of RF power is to be dropped and as the reflected wave power smoothed limit value that determines the drop amount used in the dropping control, the reflected wave power average limit value or the reflected wave power effective limit value is provided. The reflected wave power amount dropping loop system calculates the amount of error between the smoothed value, obtained by the power smoothing unit, and the reflected wave power smoothed limit value (reflected wave power average limit value or reflected wave power effective limit value) and, based on the calculated amount of error, performs the dropping control for the reflected wave power amount.

The following describes the reflected wave power peak value dropping loop system, arc blocking system, and reflected wave power amount dropping loop system.

(Reflected Wave Power Peak Value Dropping Loop System)

The reflected wave power control loop system of the present invention includes the reflected wave power peak value dropping loop system that drops (reduces) the peak value of reflected wave power. The reflected wave power peak value dropping loop system has a reflected wave power peak limit value as the threshold for determining whether the reflected wave power peak value is to be dropped.

The reflected wave power peak value dropping loop system of the present invention feeds back the difference between the peak value of reflected wave power and the reflected wave power peak limit value to the forward wave power control loop system as the feedback signal. Based on the feedback signal fed back from the reflected wave power peak value dropping loop system, the forward wave power control loop system controls the pulse width of the PWM signal, which drives the DC/DC converter provided in the RF generator unit, to control the output voltage.

The detection value of reflected wave power may include a peak generated by a sharp variation at the time plasma rises. This peak is not caused by a plasma abnormality. Therefore, if the reflected wave power peak value is dropped based on this peak value when the plasma state is normal, an incorrect control operation would be performed on the assumption that a plasma abnormality has occurred.

To avoid such an incorrect determination, the sharp variation removing unit is provided. The sharp variation removing unit outputs a signal, generated by removing a sharp variation included in the detection value of reflected wave power, as the peak value of reflected wave power. By feeding back the difference between the peak value, from which a sharp variation is removed, and the reflected wave power peak limit value to the forward wave power control loop system as the feedback signal, an incorrect operation due to a sharp variation can be avoided.

(Arc Blocking System)

The reflected wave power control loop system of the present invention includes an arc blocking system that prevents damage caused by excessive reflected wave power. When the ignition fails and an excessive amount of reflected wave power is generated, the arc blocking system stops the supply of power to the plasma load to block an arc in the plasma load. The arc blocking system has an arc limit value as the threshold for determining whether the output of RF power is to be stopped.

Based on the comparison between the peak value of reflected wave power and the arc limit value, the arc blocking system of the present invention controls the pulse control signal, which generates the RF gate signal for driving the RF amplifier unit provided in the RF generator unit, to control whether to output RF power from the RF amplifier unit. The RF amplifier unit converts a DC voltage to AC RF power, for example, via a full-bridge inverter. When converting from DC to AC, the RF amplifier unit performs amplification/conversion in synchronization with the RF gate signal that switches the switch device of the inverter. By controlling the pulse control signal that generates the RF gate signal to be sent to the RF amplifier unit, the arc blocking system can control the output of RF power.

In the arc blocking system, too, a peak included in the detection value of reflected wave power and generated by a sharp variation at plasma arise time is sometimes determined incorrectly as a plasma abnormality. To avoid such an incorrect determination, the sharp variation removing unit may be provided. Based on the comparison between the peak value of reflected wave power, from which a sharp variation is removed by the sharp variation removing unit, and the arc limit value, the arc blocking system performs the blocking control, thus avoiding an incorrect operation that may be caused by a sharp variation.

The reflected wave power peak value dropping loop system and the arc blocking system use the sharp variation removing unit to remove a variation from reflected wave power. This prevents a peak value, generated when plasma rises, from being determined incorrectly as a plasma abnormality.

(Reflected Wave Power Amount Dropping Loop System)

The reflected wave power control loop system of the present invention includes the reflected wave power amount dropping loop system that drops (reduces) the power amount of reflected wave power.

The reflected wave power amount dropping loop system of the present invention determines the duty ratio of the pulse control signal, which determines the time ratio between the ON state and the OFF state of the RF gate signal of the RF amplifier unit provided in the RF generator unit, based on the comparison between the smoothed power amount obtained by the power smoothing unit and the reflected wave power smoothed limit value, thereby controlling a drop (reduction) in the power amount of RF power of the RF amplifier unit. The power smoothing unit may be an average value circuit that calculates the average value of power or an effective value circuit that calculates the effective value of power. The reflected wave power amount dropping loop system controls a drop (reduction) in the power amount of RF power of the RF amplifier unit based on the comparison between the average value of power and the reflected wave power average limit value or based on the comparison between the effective value of power and the reflected wave power effective limit value.

The average value dropping operation or the effective value dropping operation performed by the reflected wave power amount dropping loop system reduces the duty ratio of the pulse control signal that determines the time ratio between the ON state and the OFF state of the RF gate signal. By doing so, the reflected wave power amount dropping loop system reduces the amount of reflected wave power without reducing the amplitude of the RF voltage of the RF amplifier unit and therefore reduces a heat loss in the RF power amplifier device to prevent destruction. Because the amplitude of the RF voltage of the RF amplifier unit is not reduced, the high ignition voltage can be maintained.

(Configuration of RF Power Supplying Device)

FIG. 1 is a diagram showing the general configuration of the RF power supplying device of the present invention. In FIG. 1, an RF power supplying device 1 includes an RF generator unit 10 that converts the DC voltage of a DC power supply via a DC/DC converter 12, converts/amplifies DC to AC via an RF amplifier unit 13, and supplies the converted and amplified RF power to a load 103 such as a plasma load.

The RF generator unit 10 includes a forward wave power control loop system 20 that performs feedback control based on the forward wave power feedback value PF detected by an RF sensor 16 at the output end and a reflected wave power control loop system 100 (30, 40, 50) that performs feedback control based on the reflected wave power feedback value PR detected by the RF sensor 16 at the output end. The reflected wave power control loop system 100 includes the reflected wave power peak value dropping loop system 30, arc blocking system 40, and reflected wave power amount dropping loop system 50.

The reflected wave power peak value dropping loop system 30 performs control to drop (reduce) the peak value of reflected wave power, the arc blocking system 40 performs control to block an arc in the plasma load, and the reflected wave power amount dropping loop system 50 performs control to drop (reduce) the power amount of reflected wave power.

The reflected wave power peak value dropping loop system 30 and the arc blocking system 40 of the reflected wave power control loop system 100 perform control based on the signal of a peak value obtained by removing a sharp variation from the detected reflected wave power feedback value PR via a sharp variation removing unit 31. The reflected wave power amount dropping loop system 50 of the reflected wave power control loop system 100 performs control based on the smoothed power amount calculated by smoothing the detected reflected wave power feedback value PR via a power smoothing unit 51.

The sharp variation removing unit 31 removes a sharp variation, which is the peak value generated when plasma rises, from the reflected wave power feedback value PR to prevent the sharp variation from being determined incorrectly as a plasma abnormality. The output of the sharp variation removing unit 31 is used in the control performed by the reflected wave power peak value dropping loop system 30 and the arc blocking system 40. The sharp variation removing unit 31 may be a first-order lag circuit configured by an LPF (low pass filter).

The power smoothing unit 51 outputs a value corresponding to the power value that is a smoothed value calculated as the average value or effective value of the reflected wave power feedback values PR. The reflected wave power amount dropping loop system 50 calculates the duty ratio of the pulse control signal used to control the RF amplifier unit based on the output of the power smoothing unit 51.

[Reflected Wave Power Control Method]

The reflected wave power control method of the present invention for use in an RF power supply, which supplies RF power to a plasma load, configures a feedback system that performs feedback control by feeding back the detection value of the output of the RF generator unit that converts the DC of a DC power supply to RF AC through the switching operation. In this feedback system, the detection value of forward wave power is fed back to a forward wave power control loop system and the detection value of reflected wave power is fed back to a reflected wave power control loop system 100 that includes a plurality of loop systems.

A reflected wave power peak value dropping loop system and an arc blocking system of the reflected wave power control loop system 100 control the output voltage to drop the peak value of reflected wave power or to block an arc. In the dropping control or the blocking control, a sharp variation removing unit removes a sharp variation, included in the detection value of reflected wave power, to prevent a peak value, generated at plasma rise time, from being determined as a plasma abnormality, thus preventing the dropping or the blocking from being performed incorrectly.

A reflected wave power amount dropping loop system of the reflected wave power control loop system 100 smoothes the detection values of reflected wave power via a power smoothing unit and feeds back a signal, corresponding to the smoothed power amount, to drop the power amount of reflected wave power.

(Reflected Wave Power Peak Value Dropping Control)

The reflected wave power control loop system includes a reflected wave power peak value dropping loop system. The reflected wave power peak value dropping loop system has a reflected wave power peak limit value as the threshold for determining whether the reflected wave power peak value is to be dropped. The reflected wave power peak value dropping loop system feeds back the difference between the detection value of reflected wave power and the reflected wave power peak limit value to the forward wave power control loop system to control the pulse width of the PWM signal, which drives the DC/DC converter provided in the RF generator unit, thus controlling the output voltage.

(Arc Blocking Control)

The reflected wave power control loop system includes an arc blocking system. The arc blocking system has an arc limit value as the threshold for determining whether RF power is to be output. The arc blocking system controls the RF gate signal of the RF amplifier unit provided in the RF generator unit based on the comparison between the detection value of reflected wave power and the arc limit value, thus controlling the blocking of the output of RF power of the RF amplifier unit.

In the reflected wave power peak value dropping control and the arc blocking control, the detection value of reflected wave power is sent to the sharp variation removing unit, which removes a sharp variation, included in the detection value and generated at plasma rise time, and prevents an incorrect operation.

(Reflected Wave Power Amount Dropping Control)

The reflected wave power control loop system includes a reflected wave power amount dropping loop system. Based on the comparison between the smoothed value, obtained by smoothing the detection values of reflected wave power, and the reflected wave power smoothed limit value that determines whether to drop the power amount of RF power as well as the dropping amount, the reflected wave power amount dropping loop system determines the duty ratio of the pulse control signal, which determines the time ratio between the ON state and the OFF state of the RF gate signal of the RF amplifier unit provided in the RF generator unit, thereby performing the dropping control of the power amount of RF power output from the RF amplifier unit. The smoothed value is the average value or the effective value of the detection values of reflected wave power. As the reflected wave power smoothed limit value, the reflected wave power amount dropping loop system has the reflected wave power average limit value or the reflected wave power effective limit value.

FIG. 2 is a diagram showing the outline of power control performed in the present invention. The reflected wave power control of the RF power supply of the present invention uses the RF sensor 16, provided at the output end of the RF generator unit 10, to detect reflected wave power sent from the load side to the RF generator side (S1).

A sharp variation is removed from the detection value of the detected reflected wave power (S2) and, based on the peak value of the obtained reflected wave power, the reflected wave power peak value dropping control (S3) and the arc blocking control (S4) are performed. A sharp variation can be removed by causing a first-order delay in the detection value of reflected wave power.

The reflected wave power peak value dropping control (S3) uses the PWM control signal, which is based on the peak value of reflected wave power, to drive the DC/DC converter 12 of the RF generator unit 10 for controlling the output voltage. The arc blocking control (S4) determines if plasma is ignited based on the peak value of reflected wave power and, when a high reflected wave power is generated due to an ignition failure (S7), stops the RF gate signal and stops the output from the RF amplifier unit to stop the forward wave power (S8). After stopping the forward wave power, the arc blocking control performs the re-ignition operation to perform the plasma ignition operation repeatedly (S9).

The re-ignition operation can be performed by the ignition retry function, which tries to ignite plasma, after a predetermined stop time elapses after the ignition is determined to fail. This retry function allows the user to specify the number of retries to repeat the ignition operation and the time width of the stop time. It is also possible to setup the retry function so that the retry operation is stopped if plasma cannot be ignited within the specified number of retries or to resume the retry operation after stopping the operation for a specified time.

The smoothed value of the detection values of reflected wave power can be calculated as the average value or the effective value (S5). The reflected wave power amount dropping control is performed based on the calculated smoothed value. The reflected wave power amount dropping control sets the duty ratio of the pulse control signal based on the smoothed value of reflected wave power and performs dropping control for the RF amplifier unit based on this duty ratio (S6).

The reflected wave power peak value dropping control (S3), arc blocking control (S4), and reflected wave power amount dropping control (S6), each of which has an individual threshold for starting the control, can perform the control operation independently of each other.

On the other hand, the forward wave power control of the RF power supply of the present invention uses the RF sensor 16 to detect forward wave power sent from the RF generator side to the load side (S101). The forward wave power control uses the PWM control signal, which is based on the detected amount of forward wave power, to drive the DC/DC converter 12 of the RF generator unit 10 for controlling the output voltage (S102).

FIG. 3 is a diagram showing the relation among the reflected wave power feedback, limit values, and arc blocking level.

FIG. 3A shows the forward wave power feedback value PF. In FIG. 3B, the first-order lag output of reflected wave power 202 indicates the output obtained by causing a first-order lag in the reflected wave power feedback value PR, and the smoothed value 203 indicates the average value or effective value of the reflected wave power feedback values PR. FIG. 3B also shows the limit values (reflected wave power smoothed limit value 301, reflected wave power peak limit value 302) and the arc limit value 303 that is the arc blocking level. Although a forward wave power feedback value 200 and a reflected wave power feedback value 201 are each indicated by an envelope curve in FIG. 3, the output of the RF sensor 16 may be not only a DC voltage output but also an RF AC voltage output.

The first-order lag output of reflected wave power 202 may be obtained by causing a first-order lag in the reflected wave power feedback value PR to produce a signal from which a sharp variation, which occurs sharply at plasma rise time, is reduced. This first-order lag output of reflected wave power 202 is compared with the reflected wave power peak limit value 302. As a result, if the first-order lag output of reflected wave power 202 reaches the reflected wave power peak limit value 302, the reflected wave power peak value dropping control is performed to reduce the peak value of reflected wave power.

In addition, if the first-order lag output of reflected wave power 202 further increases to the arc limit value 303 that is the arc blocking level, the ignition of plasma is determined to fail and the arc blocking control is performed. The arc blocking control stops power to be supplied to the plasma load to block an arc at the plasma load.

If the smoothed value (average value or effective value) 203 reaches the reflected wave power smoothed limit value (reflected wave power average limit value or reflected wave power effective limit value) 301, the reflected wave power amount dropping operation is performed to limit the output power amount without reducing the amplitude of the output voltage of the RF generator unit. Limiting the output power in this manner reduces a heat loss in the RF power amplifier device.

The forward wave power feedback value and the reflected wave power feedback value in FIG. 3, which are schematic examples shown for the sake of description, do not show actual examples. Nor do the limit value and the arc blocking level show actual examples.

Advantageous Effects of Invention

As described above, in an RF generator that supplies RF power to a plasma load through the pulse operation, the present invention realizes total reflected wave power tolerance, which is the ability to tolerate total reflected wave power generated when forward wave power all returns to the generator side as reflected wave power, in the non-ignition state before plasma is ignited.

In addition, the present invention prevents an incorrect determination caused by the peak of reflected wave power at plasma rise time and, at the same time, performs power control based on a variation in reflected wave power caused by a longer-period variation in the plasma state of the plasma load. This power control prevents an RF power amplifier device from being damaged by all reflected wave power and, at the same time, continues the supply of RF power without shutdown to ignite a plasma and maintains the plasma state.

BRIEF DESCRIPTION OF THE DRAWINGS

FIG. 13 is a diagram schematically showing the reflected wave power peak value dropping operations when plasma ignition succeeded and failed.

FIG. 19 is a diagram showing the forward wave power control and the reflected wave power amount dropping operation.

DESCRIPTION OF EMBODIMENT

Embodiments of the present invention are described below in detail with reference to the drawings. The following describes an RF power supplying device and a reflected wave power control method of present invention. An example of the configuration of the RF power supplying device is described with reference to FIG. 4, an example of the operation of an RF amplifier unit is described with reference to FIGS. 5 and 6, and a part of the circuit configuration of the RF power supplying device is described with reference to FIGS. 7 and 8. The operation of a forward wave power control loop system of the RF power supplying device is described with reference to FIG. 9, the operation of a reflected wave power peak value dropping loop system of the RF power supplying device is described with reference to FIG. 10 to FIG. 13, the operation of an arc blocking system of the RF power supplying device is described with reference to FIG. 14 to FIG. 16, and the operation of a reflected wave power amount dropping loop system of the RF power supplying device is described with reference to FIG. 17 to FIG. 20.

[Example of the Configuration of RF Power Supplying Device]

First, an example of the configuration of an RF power supplying device of the present invention is described with reference to FIG. 4.

Figure 4:
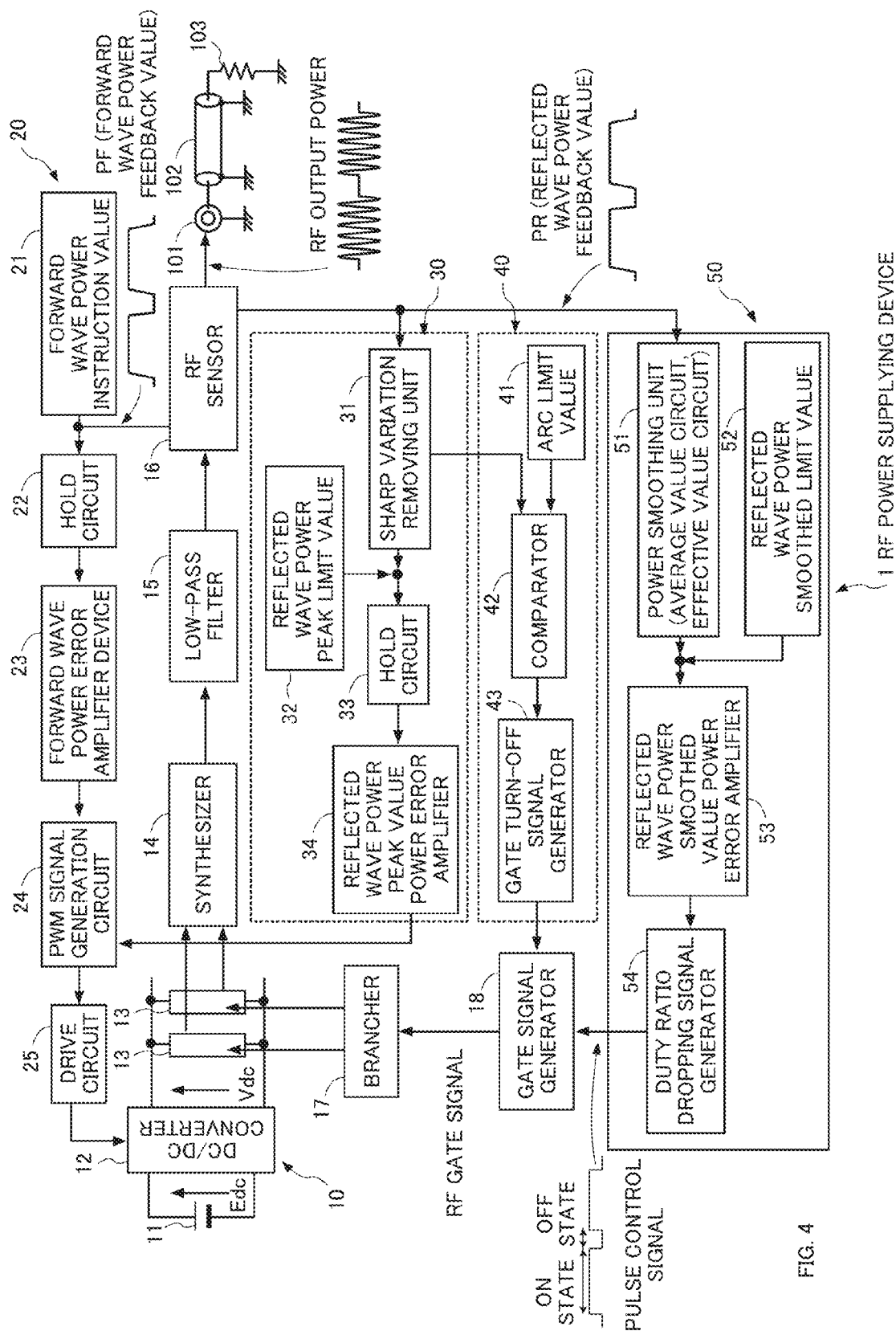
FIG. 4 is a diagram showing an example of the configuration of the RF power supplying device of the present invention.

Referring to FIG. 4, an RF power supplying device 1 of the present invention includes an RF generator unit 10 that supplies RF power to a load 103, and a generator output end 101 of the RF generator unit 10 and the load 103 are connected via a coaxial cable 102. The coaxial cable 102 is exemplary only and is not always required in this configuration; instead of the coaxial cable 102, power may be transmitted via any other transmission line.

Feedback control of the RF generator unit 10 is performed by the feedback systems including a forward wave power control loop system 20, a reflected wave power amount dropping loop system 50, a reflected wave power peak value dropping loop system 30, and an arc blocking system 40.

(RF Generator Unit)

The RF generator unit 10 includes a DC power supply 11, a DC/DC converter 12, RF amplifier units 13, a synthesizer 14, and a low-pass filter 15, with an RF sensor 16 between the low-pass filter 15 and the generator output end 101.

The DC power supply 11 is the input supply source of the DC/DC converter 12. Instead of the DC power supply 11, a DC voltage generated by rectifying and smoothing AC voltage may also be used.

The DC/DC converter 12 is a device that converts the voltage Edc of the DC power supply 11 to a variable DC voltage Vdc, and the converter may be configured by an inverter circuit or by a chopper circuit. The DC/DC converter 12 changes the conduction ratio of the semiconductor device according to the pulse width of the PWM signal, supplied from a drive circuit 25 of the forward wave power control loop system 20 and, thereby, makes variable the DC voltage Vdc of the output. The DC voltage Vdc of the output of the DC/DC converter 12 is sent to the RF amplifier unit 13.

The RF amplifier unit 13, a device that converts a DC voltage to an AC voltage, may be configured by a class-D RF amplifier circuit. The class-D RF amplifier circuit is an RF amplifier circuit that converts the DC of the DC power supply to an RF AC through the switching operation. This amplifier circuit causes the switching device in the output stage to perform ON/OFF operation based on the RF gate signal to increase and decrease the output current between 0 and the maximum value for performing the amplification operation via DC/AC conversion. A class-D RF amplifier circuit, with a small heat loss because of a small on-time resistance of the switching device, performs conversion efficiently.

The RF amplifier unit 13, implemented by a class-D amplifier circuit, may be in a full-bridge inverter configuration. This amplifier unit converts the DC voltage Vdc, received from the DC/DC converter 12, to an AC RF output power. The voltage amplitude of the RF output power of the RF amplifier unit 13 is proportional to the received DC voltage Vdc. The DC to AC amplification/conversion of the RF amplifier unit 13 is performed in synchronization with the RF gate signal supplied from a gate signal generator 18.

Figure 5:
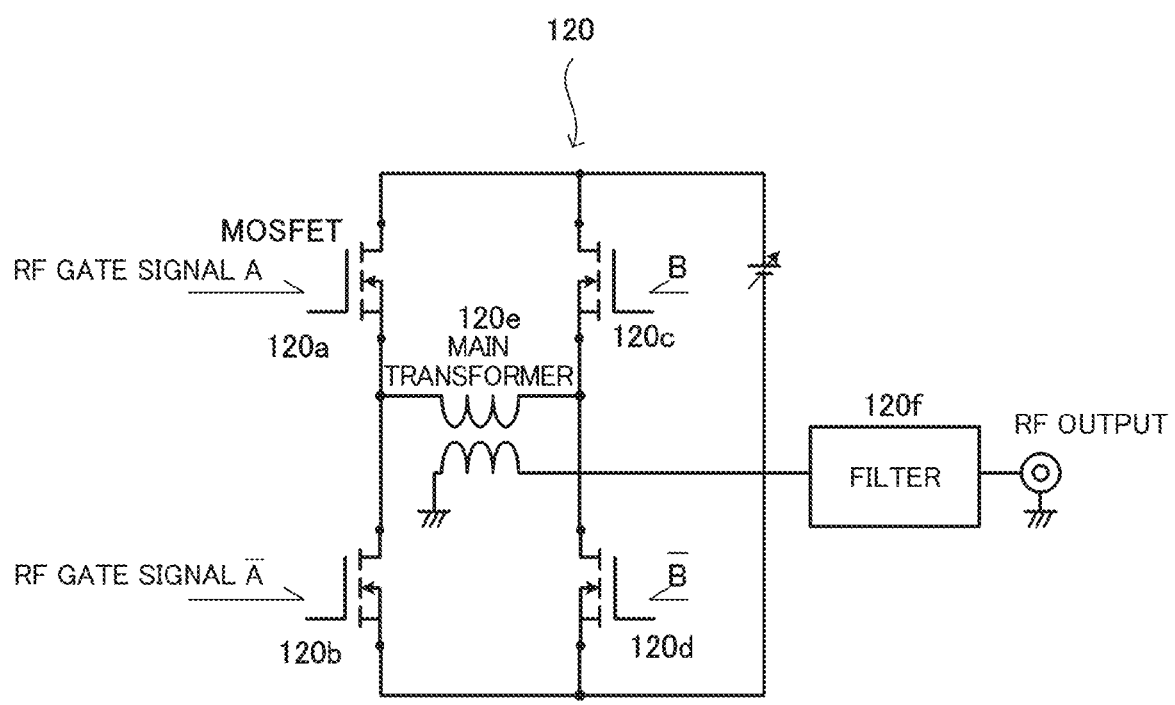
FIG. 5 is a diagram showing an example of the operation of an RF amplifier unit.

FIG. 5 is a diagram showing an example of one configuration of the RF amplifier unit included in the RF generator. FIG. 6 is a diagram showing the RF gate signal that drives and controls the RF amplifier unit, the RF output, and forward wave power and reflected wave power detected at the plasma load.

In an RF amplifier unit 120 shown in FIG. 5, MOSFETs 120a-120d are in the bridge configuration, the connection point between series-connected MOSFET 120a and MOSFET 120d and the connection point between series-connected MOSFET 120c and MOSFET 120d are connected via a main transformer 120e, and the output of the main transformer 120e, obtained via a filter 120f, is the RF output. The MOSFETs 120a-120d are driven and controlled by the RF gate signals A, A*, B, and B* (FIG. 5A, FIG. 5A).

The RF gate signals A and A* (in FIG. 5, the symbol "-" is shown above the letter A to indicate an inverse signal), which are signals for driving and controlling the series circuit of the MOSFET 120a and the MOSFET 120b, are in reverse phase. The RF gate signals B and B* (in FIG. 5, the symbol "-" is shown above the letter B to indicate an inverse signal), which are signals for driving and controlling the series circuit of the MOSFET 120c and the MOSFET 120d, are in inverse phase. The RF gate signal A and the RF gate signal Bare in inverse phase.

Figure 6A:
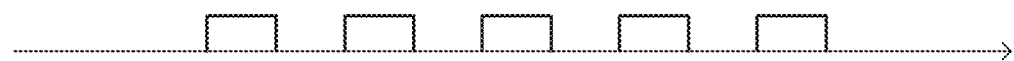
FIG. 6 is a diagram showing an example of the operation of the RF amplifier unit.
Figure 6B:
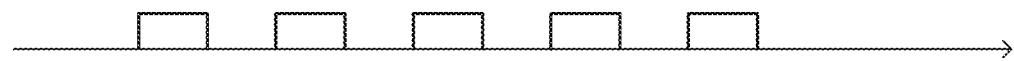
Figure 6C:
Figure 6D:
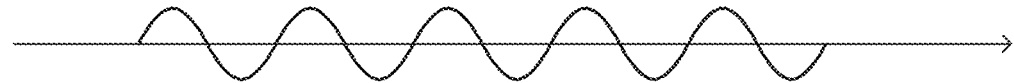

The RF gate signals A, A*, B, and B* (FIGS. 6A, 6B) are controlled by the pulse control signal (FIG. 6C). The RF gate signals A, A*, B, and B* are output when the pulse control signal is on. During this period, the RF output (FIG. 6D) is output.

Figure 6E:
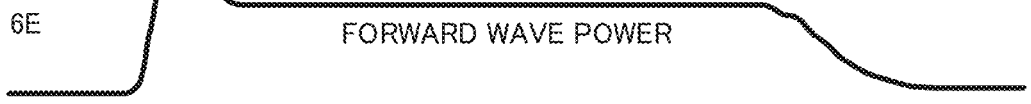
Figure 6F:
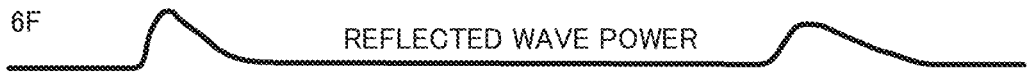

FIGS. 6E and 6F show the forward wave power and the reflected wave power received at the plasma load. Referring to FIG. 6F, the reflected wave power is generated transiently at the plasma load, on which the impedance matching box is installed, when the RF gate signal (FIGS. 6A, 6B) rises, and is attenuated after the stabilization time elapses (FIG. 6F).

The parallel connection of a plurality of RF amplifier units gives larger RF output power. In the configuration in which a plurality of RF amplifier units are connected in parallel, the AC powers at the generator output end 101 of the RF generator unit 10 are placed in phase with each other by phase-synchronizing the amplification/conversion of the RF generator units.

The synthesizer 14 is a device that combines the RF output powers, output from the plurality of RF amplifier units 13, into one. The synthesizer 14 may be omitted when one RF amplifier unit 13 is used.

The RF output power, output from the RF amplifier unit 13, and the RF output power, combined into one and output by the synthesizer 14, include many higher harmonic components. The low-pass filter 15 shapes the waveform of the RF output power, removes the higher harmonic components included in RF power, and sends RF output power, which includes fewer higher harmonic components, to the RF sensor 16.

The RF sensor 16 separately detects two powers, forward wave power and reflected wave power, included in the RF output power, and outputs them as a forward wave power feedback value PF and a reflected wave power feedback value PR. The RF output power, which passed through the RF sensor 16, is sent to the generator output end 101. The generator output end 101 connects the coaxial cable 102 and the RF generator unit 10. The generation of unwanted reflected wave power is prevented by matching the characteristic impedance of the generator output end 101 with the characteristic impedance of the coaxial cable 102.

The coaxial cable 102 supplies the RF output power, received from the generator output end 101, to the load 103.

The load 103 can match the impedance, viewed from the RF generator side, with the characteristic impedance of the generator output end 101 and the characteristic impedance of the coaxial cable 102 via the matching box (impedance matching box). The characteristic impedance and the matching impedance are, for example, 50 [ohm].

(Configuration of Forward Wave Power Control Loop System)

The forward wave power control loop system 20 is a feedback system that feeds back the forward wave power feedback value PF, detected by the RF sensor 16, to the DC/DC converter 12 so that the forward wave power of the RF generator unit 10 becomes equal to the forward wave power instruction value. The forward wave power control loop system 20 includes a hold circuit 22, a forward wave power error amplifier device 23, a PWM signal generation circuit 24, and the drive circuit 25 that are connected in series in the direction from the RF sensor 16 to the DC/DC converter 12.

A forward wave power instruction value 21 is a reference value, used during the forward wave power control, to control the magnitude of the forward wave power feedback value PF detected by the RF sensor 16. During the forward wave power control, the PWM signal is generated that has a pulse width that makes the peak value of the forward wave power feedback value PF equal to the forward wave power instruction value 21. This PWM signal is used to pulse-control the DC/DC converter 12.

The forward wave power feedback value PF, which is output by the RF sensor 16, includes the value of the Ton area and the value of the Toff area. The value of the Ton area represents the magnitude of the forward wave power. On the other hand, the value of the Toff area does not represents the magnitude of the forward wave power. The hold circuit 22 holds only the value of the Ton area of the forward wave power feedback value PF, not including the value of the Toff area, to obtain the magnitude of the forward wave power.

The hold circuit 22 turns on the switch according to the Ton area of the forward wave power feedback value PF, and turns off the switch and disconnects it according to the Toff area, to maintain the immediately preceding state, and holds the amplitude of the forward wave power feedback value. The hold circuit 22 sends the amplitude of the forward wave power feedback value PF, which is held, to the forward wave power error amplifier device 23.

Figure 7A:
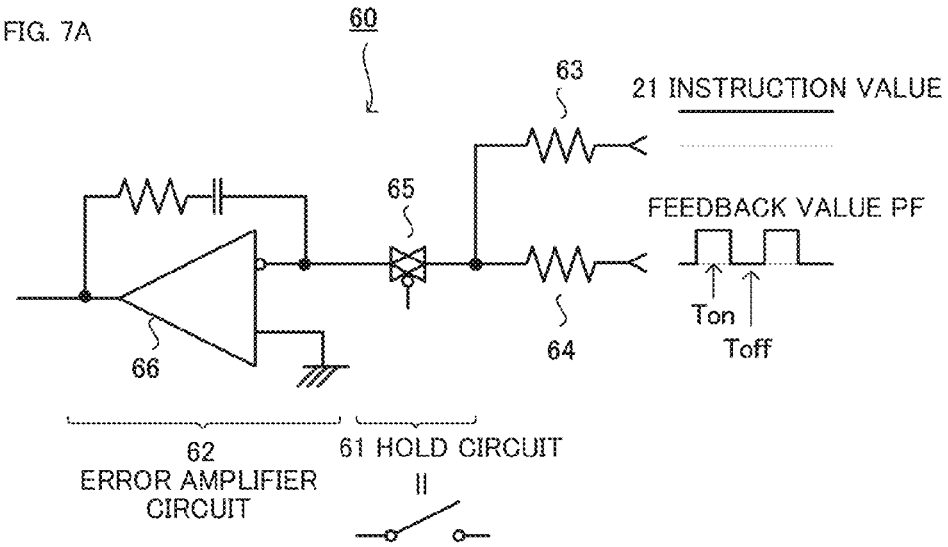
FIG. 7 is a diagram showing a part of the circuit configuration of the RF power supplying device of the present invention.

FIG. 7 is a circuit diagram showing an example of the configuration of the hold circuit 22. In a circuit 60 shown in FIG. 7A, a hold circuit 61, configured by a switch circuit 65, receives the forward wave power instruction value 21 and the forward wave power feedback value PF with a resistor 63 and a resistor 64 connected to the input end of the switch circuit 65. The switch circuit 65, which performs switching in synchronization with ON/OFF of the forward wave power feedback value PF, sends the forward wave power feedback value PF of the Ton area, as well as the forward wave power instruction value, to an error amplifier circuit 62 connected to the output end of the switch circuit 65.

The error amplifier circuit 62, configured by an operational amplifier 66, amplifies the difference between the forward wave power feedback value PF and the forward wave power instruction value. The figure shows an example in which the error amplification function is configured by hardware of the error amplifier circuit 62 that includes the operational amplifier 66. The function may be implemented not only by a hardware configuration but also by a software configuration in which the CPU runs a program to perform error amplification operation processing.

Figure 7B:
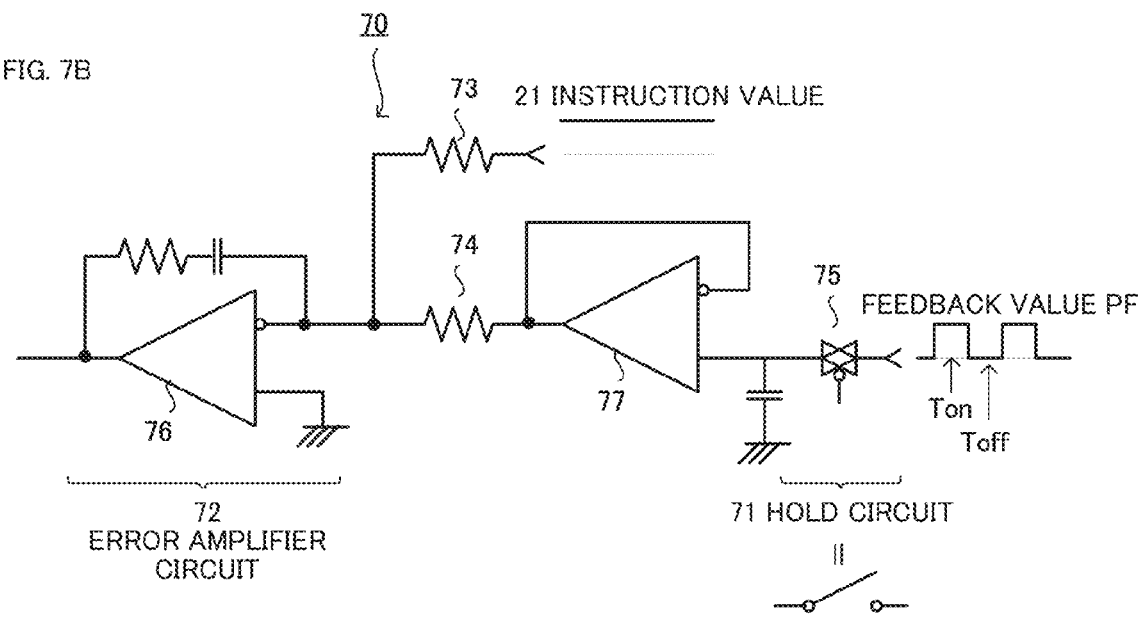

In a circuit 70 shown in FIG. 7B, a hold circuit 71, configured by a switch circuit 75 and a capacitor, receives the forward wave power feedback value PF via the input end of the switch circuit 75. The switch circuit 75 performs switching in synchronization with ON/OFF of the forward wave power feedback value PF and holds the forward wave power feedback value PF of the Ton area in the capacitor.

The voltage value held in the capacitor, which is the forward wave power feedback value PF, is sent to the error amplifier circuit 72 via a buffer circuit 77 and a resistor 74. The error amplifier circuit 72 receives the forward wave power instruction value 21 via a resistor 73. An error amplifier circuit 72, configured by an operational amplifier 76, amplifies the difference between the forward wave power feedback value PF and the forward wave power instruction value.

The forward wave power error amplifier device 23 amplifies the error between the forward wave power instruction value and the forward wave power feedback value PF with a predefined gain and outputs the resulting value as the control amount.

The PWM signal generation circuit 24 generates the PWM signal according to the larger by comparison of the two control amounts of the forward wave power error amplifier device 23 or the reflected wave power peak value power error amplifier 34.

The control amount output by the reflected wave power peak value power error amplifier 34 is the control amount by which reflected wave power peak value dropping control is performed. If the control value of the forward wave power error amplifier device 23 is larger than the control amount of the reflected wave power peak value power error amplifier 34, forward wave power control is performed according to the control amount of the forward wave power error amplifier device 23. Conversely, if the control amount of the reflected wave power peak value power error amplifier 34 is larger than the control amount of the forward wave power error amplifier device 23, reflected wave power peak value dropping control is performed according to the control amount of the reflected wave power peak value power error amplifier 34 to drop and reduce an excessive peak value of the reflected wave power.

The drive circuit 25 generates the drive signal, which amplifies power high enough for the semiconductor device in the DC/DC converter 12 to be driven, based on the PWM signal generated by the PWM signal generation circuit 24. Then, the drive circuit 25 sends the generated drive signal to the gate of the semiconductor device in the DC/DC converter 12 to cause the DC/DC converter 12 to perform the switching operation for converting the DC voltage Edc of the DC power supply 11 to the output voltage Vdc. In addition, the drive circuit 25 insulates between the reference potentials of the PWM signal generation circuit 24 and the reference potential of the DC/DC converter 12 and, if the potential of the PWM signal and the potential of the DC/DC converter 12 differ, prevents damage to, or a malfunction of, the PWM signal generation circuit 24 caused by a current from the DC/DC converter 12 to the PWM signal generation circuit 24.

(Configuration of Reflected Wave Power Peak Value Dropping Loop System)

The reflected wave power peak value dropping loop system 30 is a feedback system that drops the peak value of reflected wave power of the RF generator unit 10 by feeding back the reflected wave power feedback value PR, detected by the RF sensor 16, to the DC/DC converter 12 via the forward wave power control loop system 20. The reflected wave power peak value dropping loop system includes a sharp variation removing unit 31, a reflected wave power peak limit value 32, a hold circuit 33, and the reflected wave power peak value power error amplifier 34. The reflected wave power peak value dropping loop system 30 sends the output of the reflected wave power peak value power error amplifier 34 to the PWM signal generation circuit 24 of the forward wave power control loop system 20 for controlling the pulse width of the PWM signal that drives the DC/DC converter 12, thus dropping and reducing the peak value of the reflected wave power.

The sharp variation removing unit 31 is a circuit that removes a sharp variation generated at plasma rise time. In the plasma load, peak-like reflected wave power is generated inevitably at plasma rise time even when plasma is ignited successfully. If the reflected wave power generated at plasma rise time reaches the setting value (reflected wave power peak limit value), this rise in the reflected wave power is sometimes determined mistakenly as a rise in reflected wave power caused due to an abnormality in the plasma load. The dropping control of the reflected wave power peak, if performed based on this incorrect determination, could generate a problem that the ignited plasma will become unstable.

The sharp variation removing unit 31 removes a sharp variation included in the detected reflected wave power feedback value PR and prevents incorrect determination that may be caused due to reflected wave power generated at plasma rise time. The sharp variation removing unit 31 may be configured by a first-order lag circuit composed of a resistor and a capacitor.

Figure 8A:
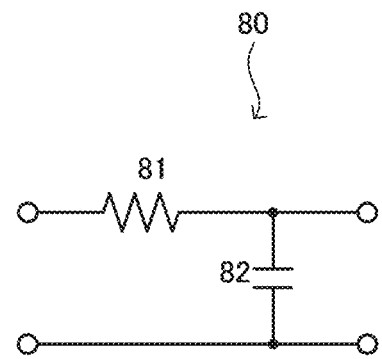
FIG. 8 is a diagram showing a part of the circuit configuration of the RF power supplying device of the present invention.

FIG. 8 is a diagram showing an example of the configuration of the sharp variation removing unit 31. FIG. 8A shows an example of the circuit in which the sharp variation removing unit 31 is configured by a first-order lag circuit 80. This circuit may be configured by a low pass filter (LPF) composed of a resistor 81 and a capacitor 82.

Figure 8B:
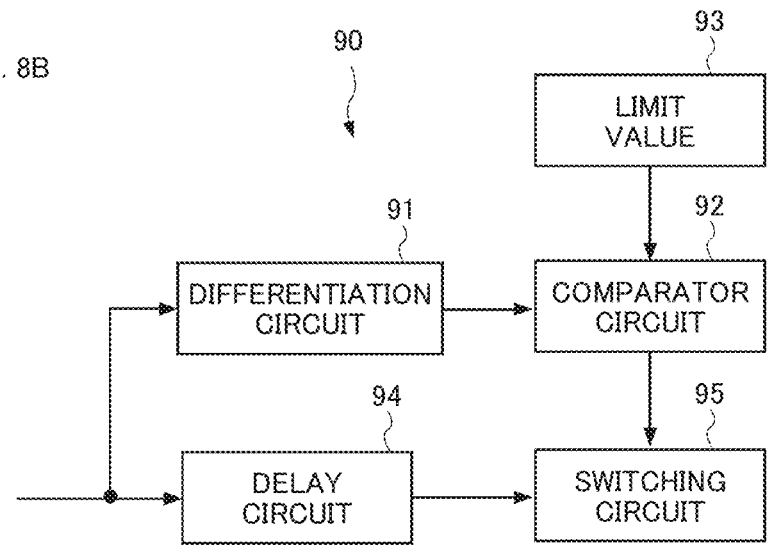

FIG. 8B shows another example of the configuration of the sharp variation removing unit 31. The sharp variation removing unit 31 may be configured by a filter circuit 90 that removes RF components. A switching circuit 95 switches the output of the detection signal of reflected wave power and outputs only the signal from which a sharp variation, included in the detection signal, is removed. A sharp variation is detected by a differentiation circuit 91, a comparator circuit 92, and a limit value 93. A variation in the detection signal is detected by the differentiation circuit 91, and the detected differentiation value and the limit value 93 are compared to detect a sharp variation. The switching circuit 95 places a sharp variation in the OFF state based on the output of the comparator circuit 92 and stops the output of the detection signal; on the other hand, the switching circuit 95 places a signal, which does not include a sharp variation, in the ON state and outputs the detection signal. A delay circuit 94 delays the detection signal for the time, required for the processing of the differentiation circuit 91 and the comparator circuit 92, to adjust the time of switching performed by the switching circuit 95.

In FIG. 4, the reflected wave power peak limit value 32 is a reference value with which the output of the sharp variation removing unit 31 is compared when the reflected wave power peak value dropping operation is performed. This value is a pre-set value. During the reflected wave power peak value dropping operation, the peak value of the reflected wave power feedback is limited to a value equal to or smaller than the reflected wave power peak limit value 32.

The hold circuit 33 may have a configuration similar to that of the hold circuit 22 provided in the forward wave power control loop system 20. The hold circuit 33 turns on the switch according to the Ton area of the reflected wave power feedback value PR, and turns off and disconnects the switch according to the Toff area, to maintain the immediately preceding state and holds the amplitude of the reflected wave power feedback value. The hold circuit 33 sends the amplitude of the reflected wave power feedback value PR, which is held, to the reflected wave power peak value power error amplifier 34.

The reflected wave power peak value power error amplifier 34 amplifies the difference between the reflected wave power peak limit value 32 and the output of the sharp variation removing unit 31 with a pre-set gain and outputs the resulting value as the control amount.

The control amount output by the reflected wave power peak value power error amplifier 34 is the control amount by which the reflected wave power peak value dropping control is performed. The PWM signal generation circuit 24 receives the output of the reflected wave power peak value power error amplifier 34 and the output of the forward wave power error amplifier device 23. If the control amount of the reflected wave power peak value power error amplifier 34 is larger than the control amount of the forward wave power error amplifier device 23, reflected wave power peak value dropping control is performed according to the control amount of the reflected wave power peak value power error amplifier 34 to drop an excessive peak value of the reflected wave power.

(Configuration of Arc Blocking System)

The arc blocking system 40 is a feedback system that feeds back the reflected wave power feedback value PR, detected by the RF sensor 16, to the RF amplifier unit 13 to control the blocking of an arc by stopping power supplied to the plasma load. The arc blocking system 40 includes the sharp variation removing unit 31, provided in the reflected wave power peak value dropping loop system 30, as well as an arc limit value 41, a comparator 42, and a gate turn-off signal generator 43, and sends the output of the gate turn-off signal generator 43 to the gate signal generator 18. By doing so, the arc blocking system 40 controls the duty ratio of the pulse control signal, which controls ON/OFF of the RF gate signal that drives the RF amplifier unit 13, in order to block an arc.

In addition to the configuration in which the sharp variation removing unit 31 provided in the reflected wave power peak value dropping loop system 30 is used also in the arc blocking system 40, other configurations are also possible. For example, the sharp variation removing unit 31 may be provided separately in the arc blocking system 40. A still another configuration is that the sharp variation removing unit is provided independently of the reflected wave power peak value dropping loop system 30 and the arc blocking system 40; in this case, the detection value of the reflected wave power, from which a sharp variation is removed, is sent to both feedback systems, that is, to the reflected wave power peak value dropping loop system 30 and the arc blocking system 40.

The arc limit value 41 is a level value used to determine whether plasma load ignition succeeded or failed. Whether plasma load ignition succeeded or failed is determined by determining whether the detection value, generated by removing a sharp variation from the reflected wave power feedback value PR, has reached the arc limit value 41. The reflected wave power feedback value PR increases when the plasma load ignition failed. Therefore, if the output of the sharp variation removing unit 31 has reached the arc limit value 41, it is detected that plasma load ignition failed.

The comparator 42 is a comparator that compares the arc limit value 41 and the output of the sharp variation removing unit 31 to determine the ignition state of the plasma load. The comparator 42 determines that the ignition succeeded if the output of the sharp variation removing unit 31 is equal to or smaller than the arc limit value 41; conversely, the comparator 42 determines that the ignition failed if the output of the sharp variation removing unit 31 exceeds the arc limit value 41.

The gate turn-off signal generator 43 sends the gate turn-off signal to the gate signal generator 18 according to the ignition determination signal output by the comparator 42. When ignition succeeded, the gate turn-off signal generator 43 does not send the gate turn-off signal but permits the gate signal generator 18 to output the RF gate signal. When ignition failed, the gate turn-off signal generator 43 sends the gate turn-off signal to inhibit the gate signal generator 18 from outputting the RF gate signal.

The gate signal generator 18 is a circuit that supplies the RF gate signal that controls RF gate power required to drive the RF power amplifier device in the RF amplifier unit 13. The gate signal generator 18 applies the generated RF gate signal to the bridge-configured MOSFETs 120 in the RF amplifier unit 13 shown in FIG. 5 to alternately switch the MOSFETs 120 between on and off for generating an RF output.

The pulse control signal is the control signal used to control the output of the RF gate signal. When in the ON state, the pulse control signal causes the gate signal generator 18 to output the RF gate signal and, when in the OFF state, causes the gate signal generator 18 to stop the RF gate signal. Controlling the duty ratio, which is determined by the time width ratio between the ON state and the OFF state (=ON state/(ON state+OFF state)), controls the power amount that is output by the RF amplifier unit 13.

During the usual pulse operation time, the RF amplifier unit 13 is driven with a duty ratio, equal to the duty ratio of the pulse control signal that is pre-set in the gate signal generator 18, to output RF power.

When the gate turn-off signal is received from the gate turn-off signal generator 43, the gate signal generator 18 stops the output of the pulse control signal or reduces the duty ratio to reduce RF power, output by the RF amplifier unit 13, or stops RF power.

A brancher 17 is a circuit that branches and supplies the pulse control signal, output by the gate signal generator 18, to each of the RF amplifier units when there is a plurality of RF amplifier units 13. When there is only one RF amplifier unit, the brancher 17 is not required.

(Configuration of Reflected Wave Power Amount Dropping Loop System)

The reflected wave power amount dropping loop system 50 is a feedback system that feeds back the reflected wave power feedback value PR, detected by the RF sensor 16, to the RF amplifier unit 13 to drop the power amount of the reflected wave power of the RF generator unit 10. The reflected wave power amount dropping loop system 50 includes a power smoothing unit 51 that is a smoothing unit for smoothing the power of the reflected wave power feedback value, a reflected wave power smoothed limit value 52 that is used as the threshold of the smoothed reflected wave power smoothed value, a reflected wave power smoothed value power error amplifier device 53 that amplifies power based on the difference between the reflected wave power smoothed value and the reflected wave power limit value, and a duty ratio dropping signal generator 54 that determines the duty ratio of the pulse control signal based on the output of the reflected wave power smoothed value power error amplifier device 53. The reflected wave power amount dropping loop system 50 sends the output of the duty ratio dropping signal generator 54 to the gate signal generator 18. The reflected wave power amount dropping loop system 50 controls the duty ratio of the pulse control signal to drop and reduce the power amount of the reflected wave power.

Because it is required to control the power amount without changing the voltage amplitude of reflected wave power, the reflected wave power amount dropping loop system 50 includes the power smoothing unit 51, which calculates the average value or the effective value, as means for smoothing the reflected wave power feedback value PR. The reflected wave power amount dropping loop system 50 feeds back the calculated control amount to the RF amplifier unit 13 to control the power amount.

With the average value or the effective value of reflected wave power as the reflected wave power smoothed value, the reflected wave power amount dropping loop system 50 performs the reflected wave power dropping operation to make the reflected wave power smoothed value equal to or smaller than the reference value. In the description below, the dropping operation performed based on the average value of reflected wave power is referred to as the reflected wave power average value dropping operation, while the dropping operation performed based on the effective value of reflected wave power is referred to as the reflected wave power effective value dropping operation.

The power smoothing unit 51, which is a circuit that smoothes the reflected wave power feedback value PR for outputting a reflected wave power smoothed value, includes an average value circuit or an effective value circuit. The average value circuit and the effective value circuit are each a circuit that calculates the average value or the effective value of the reflected wave power feedback values PR generated during the pulse operation of the RF generator unit 10. This circuit may be configured not only by a hardware circuit but also as software operation processing. The average value circuit, when configured by hardware, may be configured by a first-order lag circuit composed of a resistor and a capacitor.

A reflected wave power smoothed value is calculated by smoothing the reflected wave power feedback values PR as described above. This reduces heat loss in, and prevents damage to, the RF power amplifier device, not by reducing the amplitude of RF output power, but by reducing the duty ratio of the pulse control signal.

The reflected wave power smoothed limit value (reflected wave power average limit value, reflected wave power effective limit value) is the reference value to be compared with the output of the power smoothing unit (average value circuit, effective value circuit) 51 when the reflected wave power smoothed value dropping operation (reflected wave power average value dropping operation, reflected wave power effective value dropping operation) is performed. So that the smoothed value (average value, effective value) of the reflected wave power feedback values PR becomes equal to or smaller than the reflected wave power smoothed limit value (reflected wave power average limit value, reflected wave power effective limit value) during the reflected wave power smoothed value dropping operation (reflected wave power average value dropping operation, reflected wave power effective value dropping operation), the duty ratio of the pulse control signal is adjusted, the ON state of the RF gate signal generated by the gate signal generator 18 is limited, and the power amount of reflected wave power is dropped (reduced).

The reflected wave power smoothed value power error amplifier (reflected wave power average value power error amplifier device, reflected wave power effective value power error amplifier device) 53 amplifies the error, which is the difference between the reflected wave power smoothed limit value (reflected wave power average limit value, reflected wave power effective limit value) 52 and the output of the power smoothing unit (average value circuit, effective value circuit) 51, with a predefined gain and outputs the result as the control amount.

The duty ratio dropping signal generator 54 is a circuit that determines the duty ratio between the ON state and the OFF state at pulse operation time according to the control amount output by the reflected wave power smoothed value power error amplifier device (reflected wave power average value power error amplifier device, reflected wave power effective value power error amplifier device) 53.

During the reflected wave power smoothed value dropping operation, the gate signal generator 18 receives the pulse control signal from the duty ratio dropping signal generator 54 and generates the RF gate signal whose ON state and OFF state are based on the duty ratio of the pulse control signal. The gate signal generator 18 also receives the gate turn-off signal from the gate turn-off signal generator 43 of the arc blocking system 40. This gate turn-off signal has priority over the duty ratio signal and stops the RF gate signal.

When the operation does not move to the reflected wave power average value dropping operation but the usual forward wave power control is performed, the duty ratio dropping signal generator 54 does not generate the duty ratio dropping signal but generates the gate signal with the pulse control signal, which has a pre-set fixed duty ratio, and performs the pulse operation.

The following describes an example of the control of the RF power supplying device of the present invention.

[Example of Control of RF Power Supplying Device]

(Forward Wave Power Control)

First, the forward wave power control performed by the forward wave power control loop system is described with reference to FIG. 9.

Figure 9:
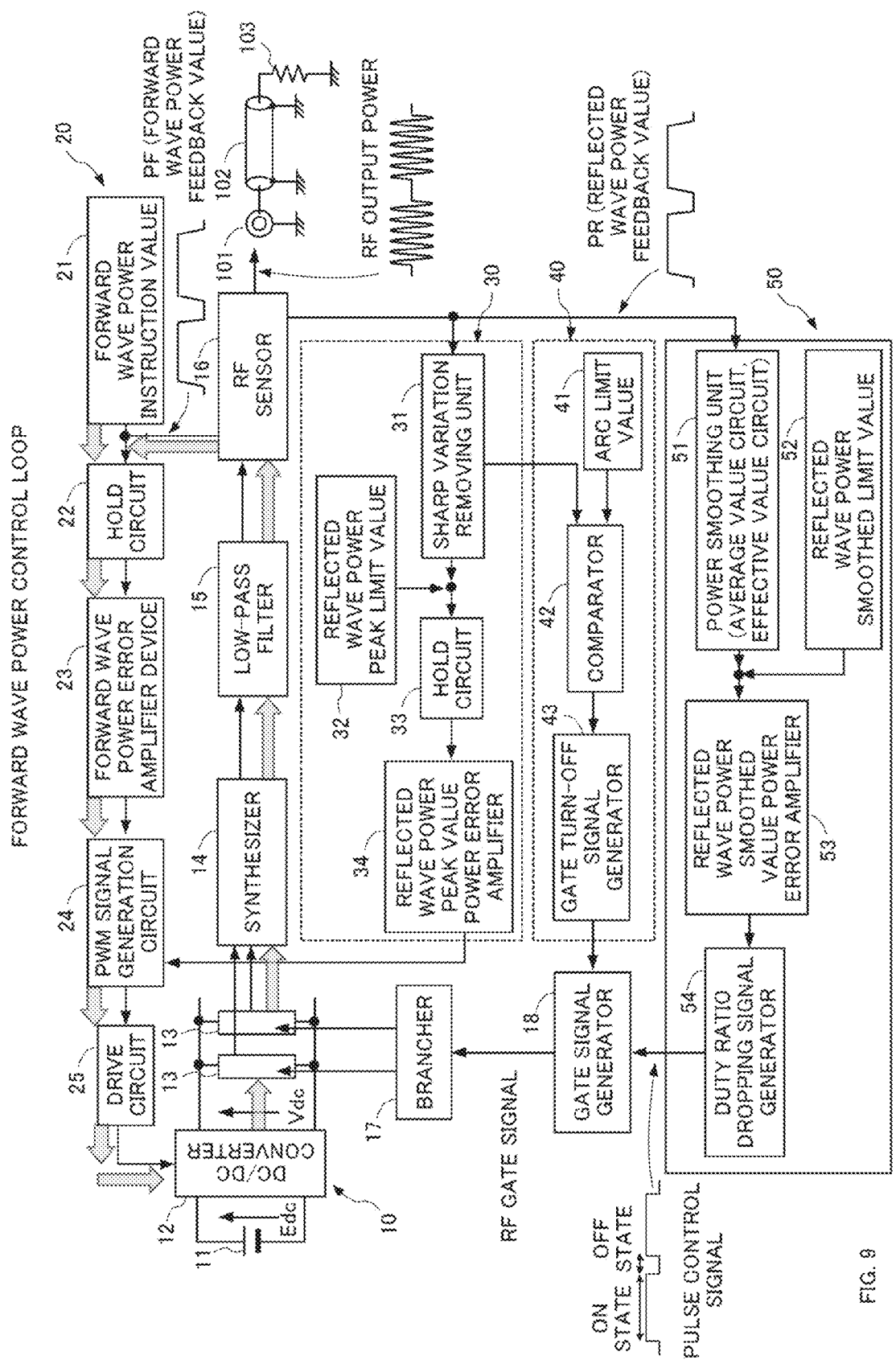
FIG. 9 is a diagram showing the operation of a forward wave power control loop system of the RF power supplying device of the present invention.

When the impedance of the load 103 is matched to 50 [ohm] and there is no reflected wave power, the forward wave power control is performed by the forward wave power control loop system 20 shown in FIG. 9 (indicated by bold arrows).

During the forward wave power control, the output Vdc of the DC/DC converter 12 is made variable to control the amplitude of the RF output power so that the forward wave power instruction value 21 always matches the peak value of the forward wave power feedback value PF.

(Switching Control)

When the impedance of the load 103 is not matched to 50 [ohm] during the forward wave power control and the condition (1), (2), or (3) given below is satisfied, the control loop moves from the forward wave power control loop system 20 to a reflected wave power control loop system 100 (reflected wave power peak value dropping loop system 30, arc blocking system 40, or reflected wave power amount dropping loop system 50) in which the dropping operation or the blocking operation is performed.

(1) If a first-order lag output 202, from which a sharp variation in reflected wave power is removed, reaches a reflected wave power peak limit value 302 as shown in FIG.

3B, the reflected wave power peak value dropping loop system 30 is activated to start the reflected wave power peak value dropping operation.

Figure 1:
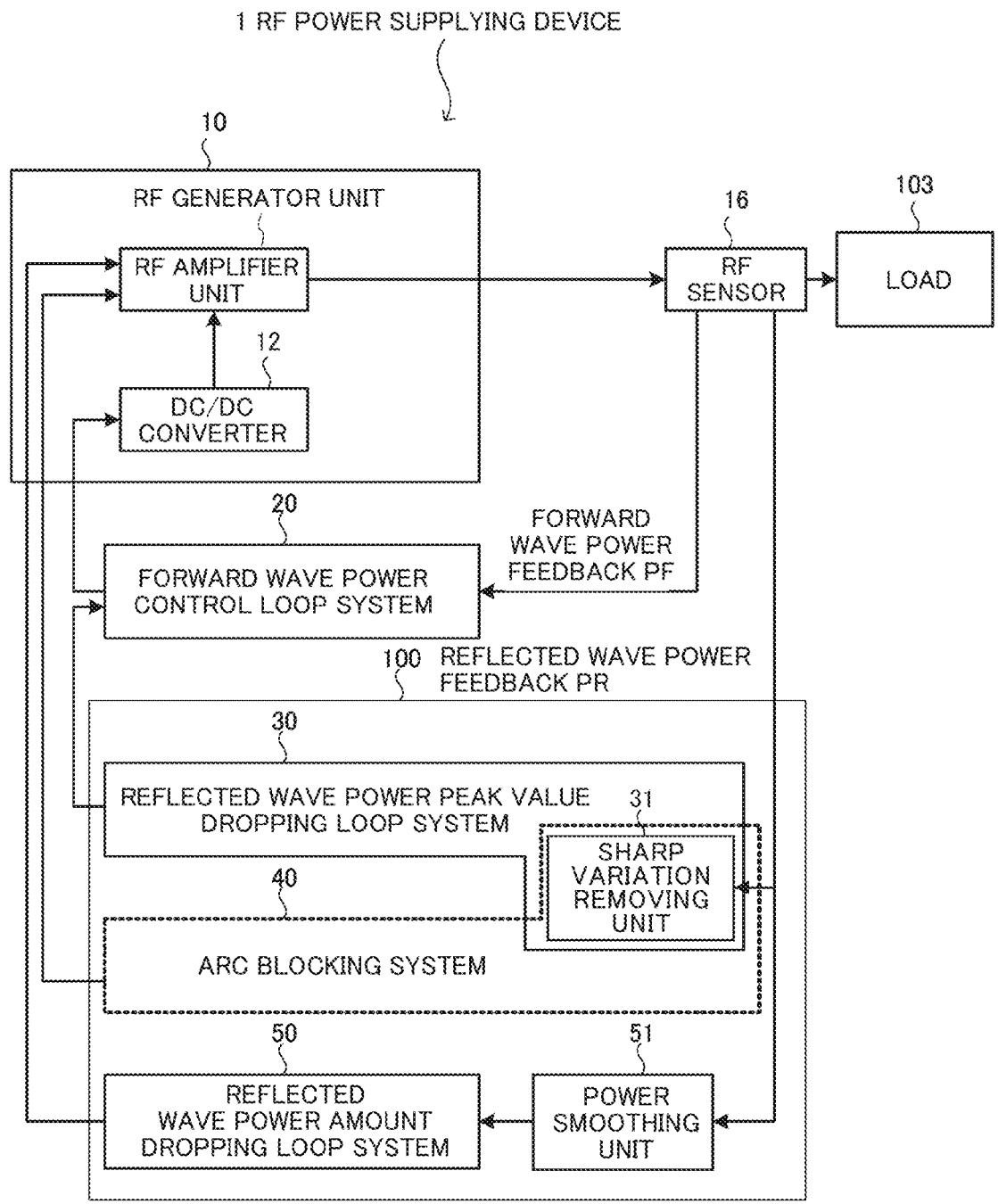
FIG. 1 is a diagram showing the general configuration of an RF power supplying device of the present invention.
Figure 2:
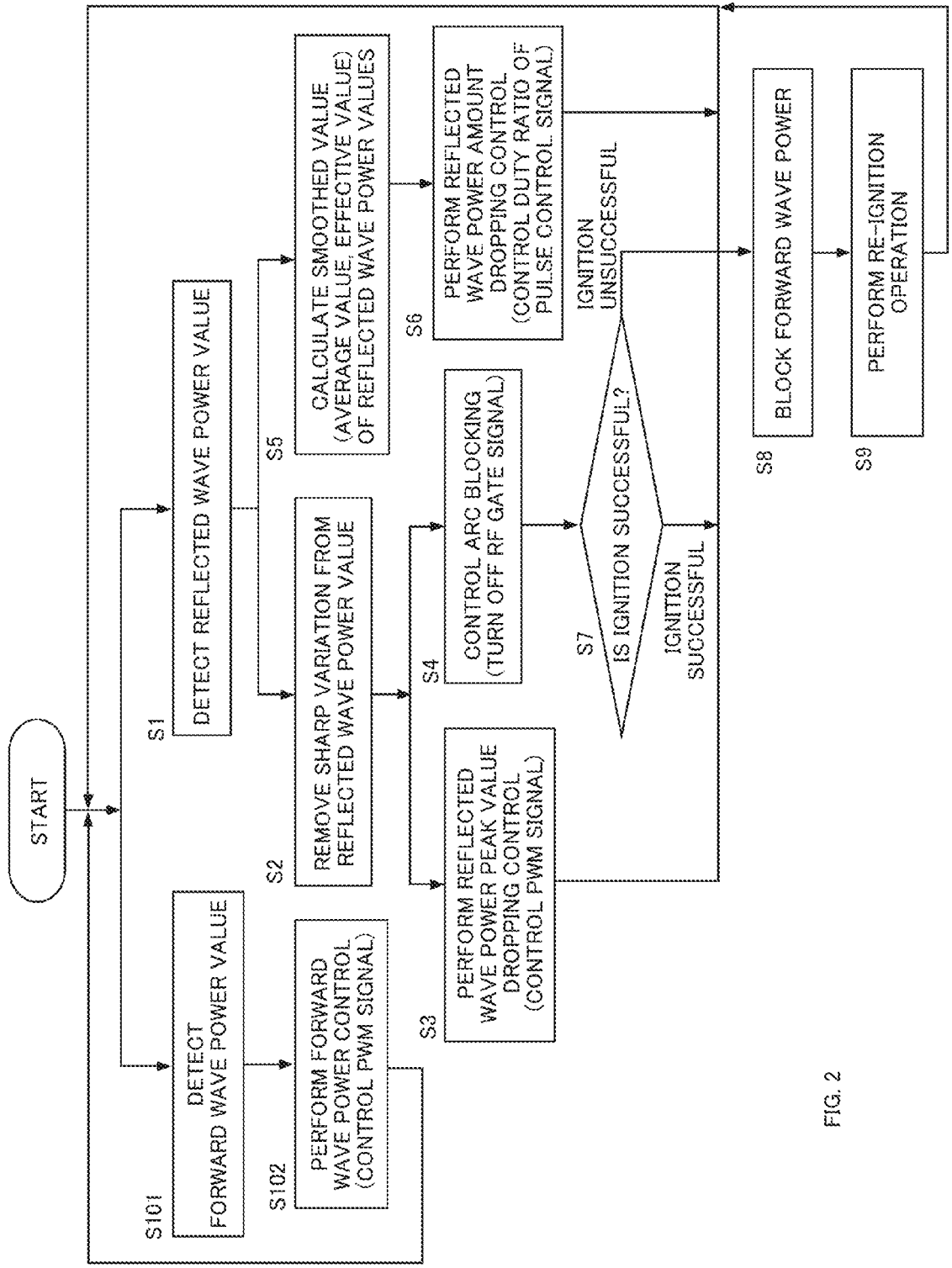
FIG. 2 is a diagram showing the outline of a reflected wave power control method of the present invention.
Figure 3A:
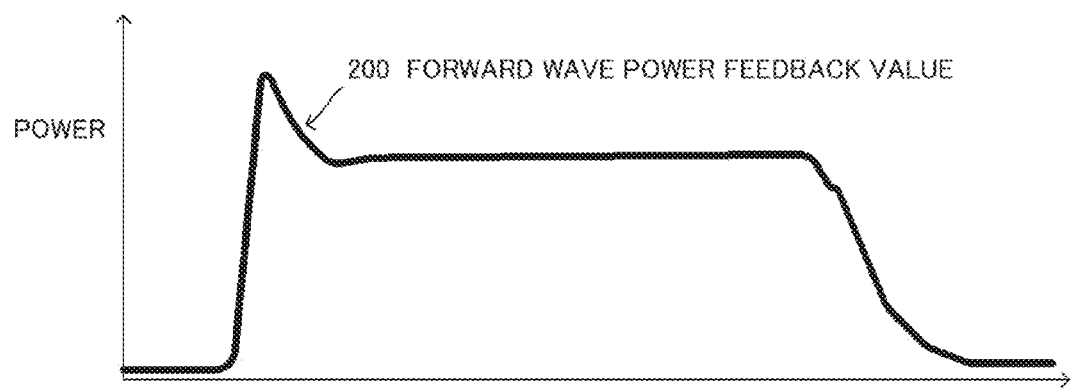
FIG. 3 is a diagram showing the relation among a reflected wave power feedback value, limit values, and an arc blocking level.
Figure 3B:
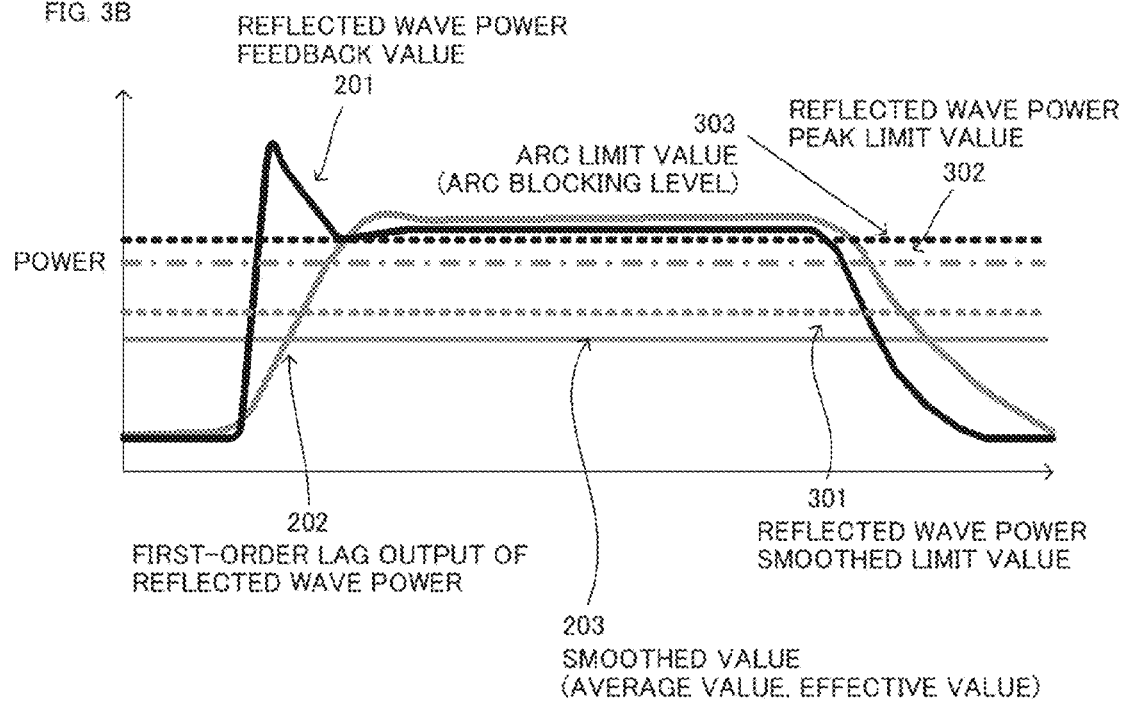

(2) If the first-order lag output 202, from which a sharp variation in reflected wave power is removed, reaches an arc limit value 303 as shown in FIG. 3B, the arc blocking system 40 is activated to start the arc blocking operation.

(3) If a smoothed value 203 of reflected wave power calculated by the power smoothing unit (average value circuit, effective value circuit) 51 reaches a reflected wave power smoothed value limit value (reflected wave power average limit value, reflected wave power effective value limit value) 301 as shown in FIG. 3B, the reflected wave power amount dropping operation is started. The dropping operation and the blocking operation described above operate independently of each other.

(Reflected Wave Power Peak Value Dropping Control)

Figure 10:
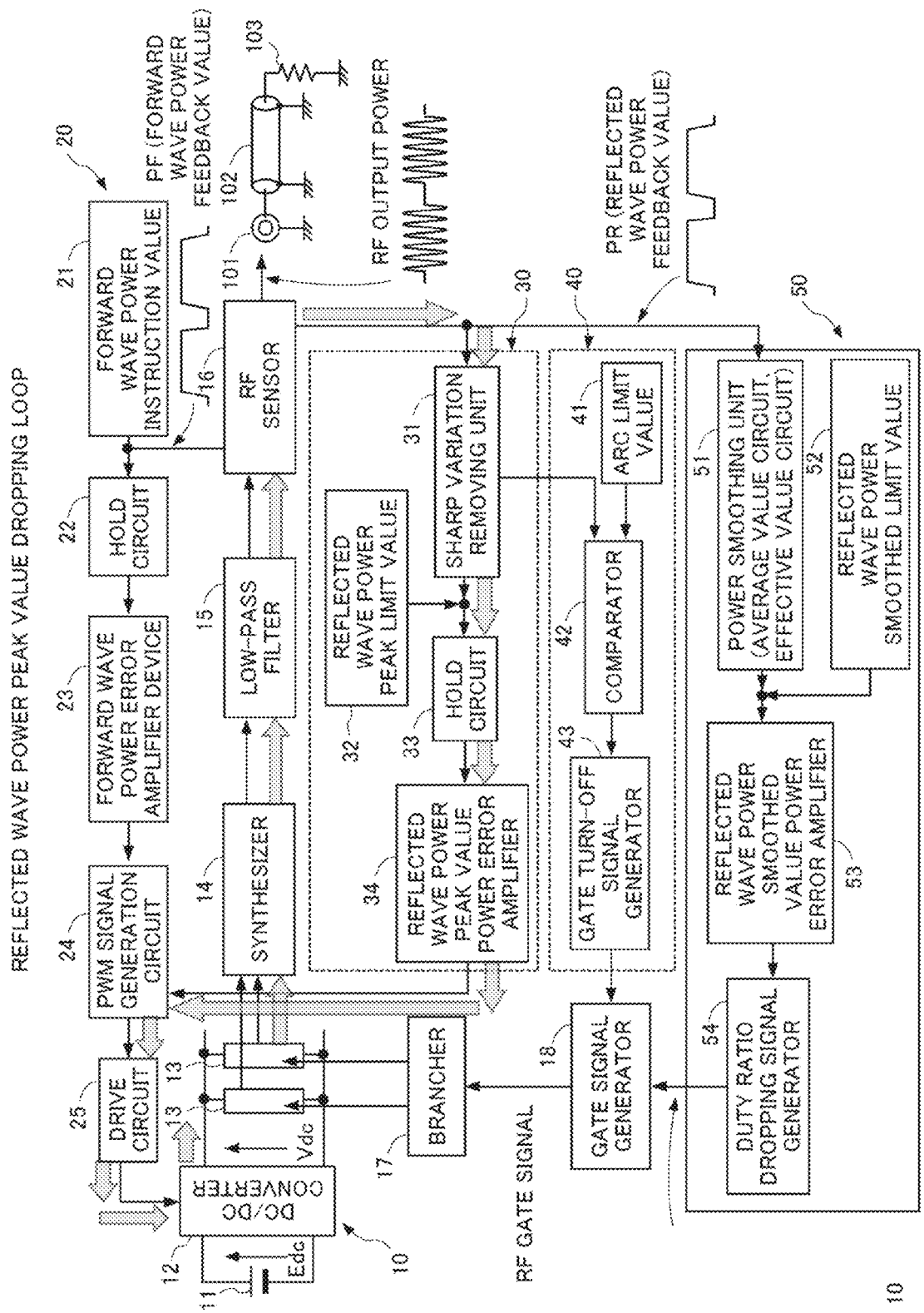
FIG. 10 is a diagram showing the operation of a reflected wave power peak value dropping loop system of the RF power supplying device of the present invention.

Next, the reflected wave power peak value dropping control is described below with reference to FIG. 10 to FIG. 13. FIG. 10 shows the reflected wave power peak value dropping control loop system.

When the impedance of the load is not matched to 50 [ohm] and impedance matching is not achieved, reflected wave power is generated. If the output (for example, first-order lag output) obtained by removing a sharp variation in reflected wave power from the reflected wave power feedback value PR, which is obtained by detecting the reflected wave power, exceeds the reflected wave power peak limit value 32, the reflected wave power peak value dropping loop system 30 shown in FIG. 10 (indicated by bold arrows) performs the reflected wave power peak value dropping operation.

By controlling the DC/DC converter 12 so that the output of the sharp variation removing unit 31 does not exceed the reflected wave power peak limit value 32, the amplitude of the RF output power is limited to a predetermined value or lower. This reflected wave power peak value dropping operation protects the RF power amplifier device from an overload or a surge voltage when reflected wave power is generated, and prevents the RF power amplifier device from being destroyed.

When the reflected wave power is reduced and the output of the sharp variation removing unit 31 falls below the reflected wave power peak limit value 32, the control returns to the forward wave power control again.

Figure 11:
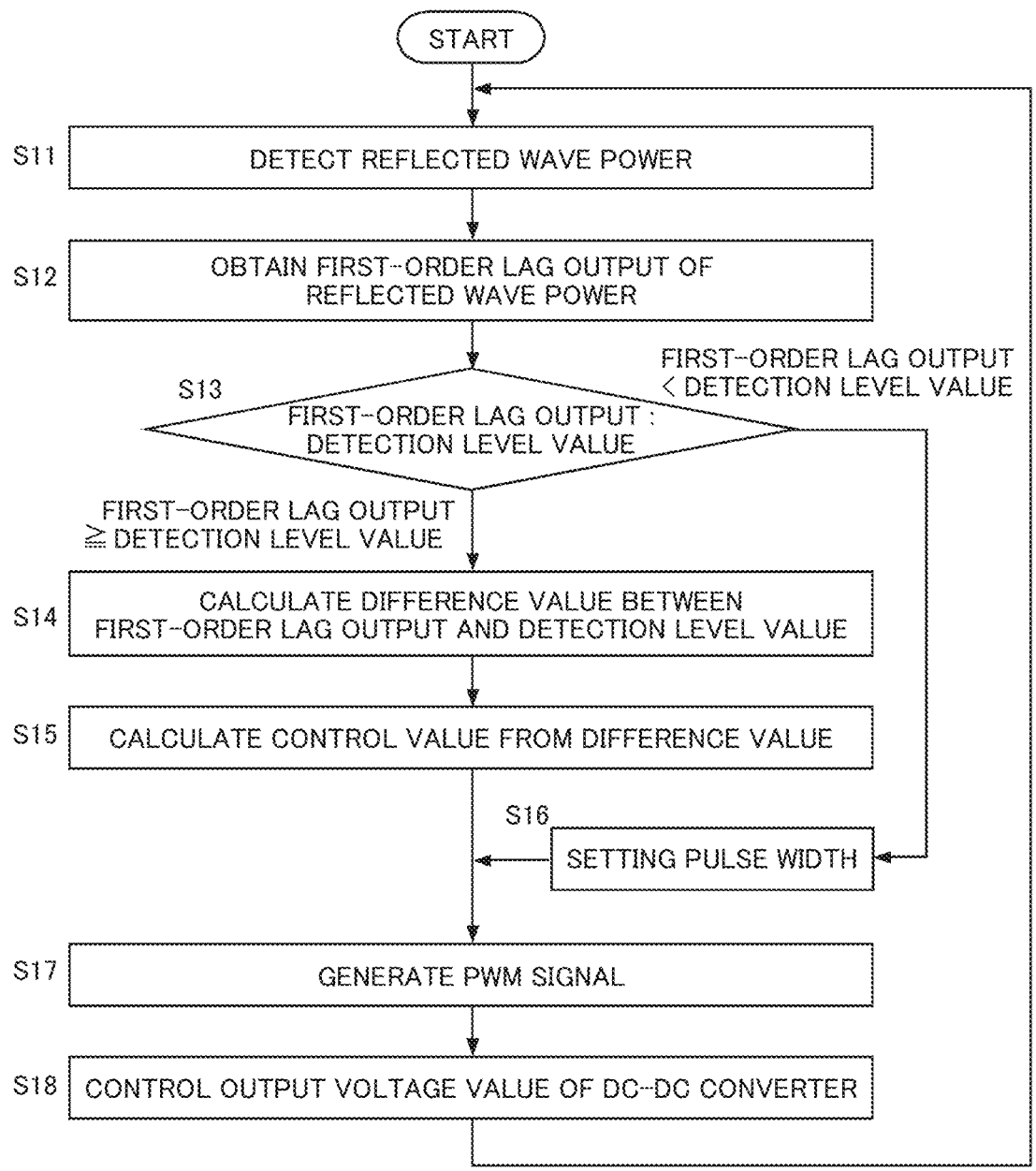
FIG. 11 is a flowchart showing the operation of the reflected wave power peak value dropping loop system of the RF power supplying device of the present invention.

In the flowchart shown in FIG. 11, the RF sensor 16 detects reflected wave power (S11) and sends the detected reflected wave power to the sharp variation removing unit 31 to obtain the output (for example, first-order lag output) from which a sharp variation is removed (S12). If the output (for example, first-order lag output), from which a sharp variation in the reflected wave power is removed, exceeds the reflected wave power peak limit value 32 that is the detection level of the reflected wave power peak value (S13), the difference between the output (for example, first-order lag output), from which a sharp variation in the reflected wave power is removed, and the reflected wave power peak limit value 32 is calculated (S14) and, based on this difference, the control value is calculated (S15). Based on the control value, the PWM signal generation circuit 24 generates the PWM signal (S17). The difference and the control value can be generated by the reflected wave power peak value power error amplifier 34.

On the other hand, if the output (for example, first-order lag output), from which a sharp variation in the reflected wave power is removed, does not exceed the reflected wave power peak limit value 32 (S13), the PWM signal generation circuit 24 generates the PWM signal (S17) based on the predetermined setting pulse width (S16). The DC/DC converter 12 is driven by the generated PWM signal to control the output voltage value (S18).

Figure 12:
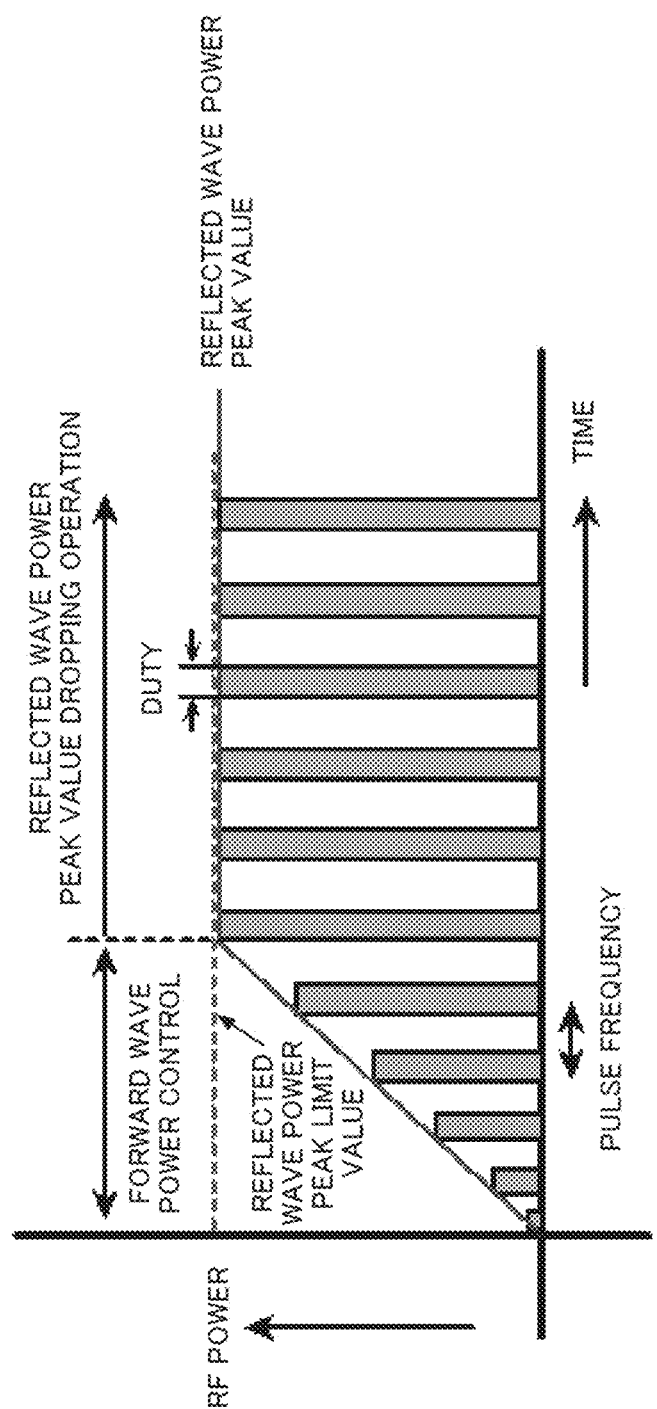
FIG. 12 is a diagram showing the forward wave power control and the reflected wave power peak value dropping operation.

FIG. 12 is a diagram showing the forward wave power control and the reflected wave power peak value dropping operation. The horizontal axis of FIG. 12 indicates the time, and the vertical axis indicates the reflected wave power.

In the forward wave power control, the DC/DC converter is driven by the PWM signal with the predetermined pulse width. This driving increases forward wave power (not shown) and, at the same time, increases reflected wave power. When the peak value of the reflected wave power reaches the reflected wave power peak limit value, the reflected wave power peak value dropping operation is started. The reflected wave power peak value dropping operation decreases the pulse width of the PWM signal so that the peak value of reflected wave power does not exceed the reflected wave power peak limit value.

FIG. 13 schematically shows the reflected wave power peak value dropping operation when plasma ignition succeeded and when plasma ignition failed. The waveforms shown in FIG. 13 are not actual waveforms but are simplified for the sake of description. FIG. 13A shows the forward wave power feedback value. In FIGS. 13B and 13E, the bold solid line indicates the reflected wave power feedback value PR, the light solid line indicates the first-order lag output of the reflected wave power feedback value, and the chain line indicates the peak dropping detection level.

FIGS. 13A to 13D show the waveform when the ignition succeeded, and FIGS. 13E to 13G show the waveform when the ignition failed.

When the ignition succeeded, the reflected wave power increases at the plasma rise time T1 and at the plasma fall time T2. At this time, if the reflected wave power peak value dropping operation is performed based on the reflected wave power feedback value PR (indicated by bold solid line), it is incorrectly determined that an abnormal condition is generated even when the normal ignition operation is performed. This reduces the amplitude of the forward wave power, making it difficult to maintain plasma.

On the other hand, the output generated by removing a sharp variation from the reflected wave power feedback value (for example, first-order lag output)(indicated by light solid line) does not reach the peak dropping detection level and, therefore, the reflected wave power peak value dropping operation is not performed. In this case, the PWM signal is not changed (FIG. 13D) and the forward wave power control is maintained.

When the ignition failed, the output generated by removing a sharp variation from the reflected wave power feedback value (for example, first-order lag output) (indicated by light solid line) reaches the peak dropping detection level at the time T3, which is after the time T1, at ignition failure time and the reflected wave power peak value dropping operation is started. The pulse width of the PWM signal is generated (FIG. 13G) based on the difference (FIG. 13F) between the first-order lag output of the reflected wave power and the peak dropping detection level, and the reflected wave power voltage peak is dropped.

When the output from which a sharp variation in the reflected wave power is removed (for example, first-order lag output) is reduced and falls below the peak dropping detection level, the reflected wave power peak value dropping operation is terminated and the operation returns from the reflected wave power peak value dropping control to the forward wave power control.

(Arc Blocking Control)

Figure 14:
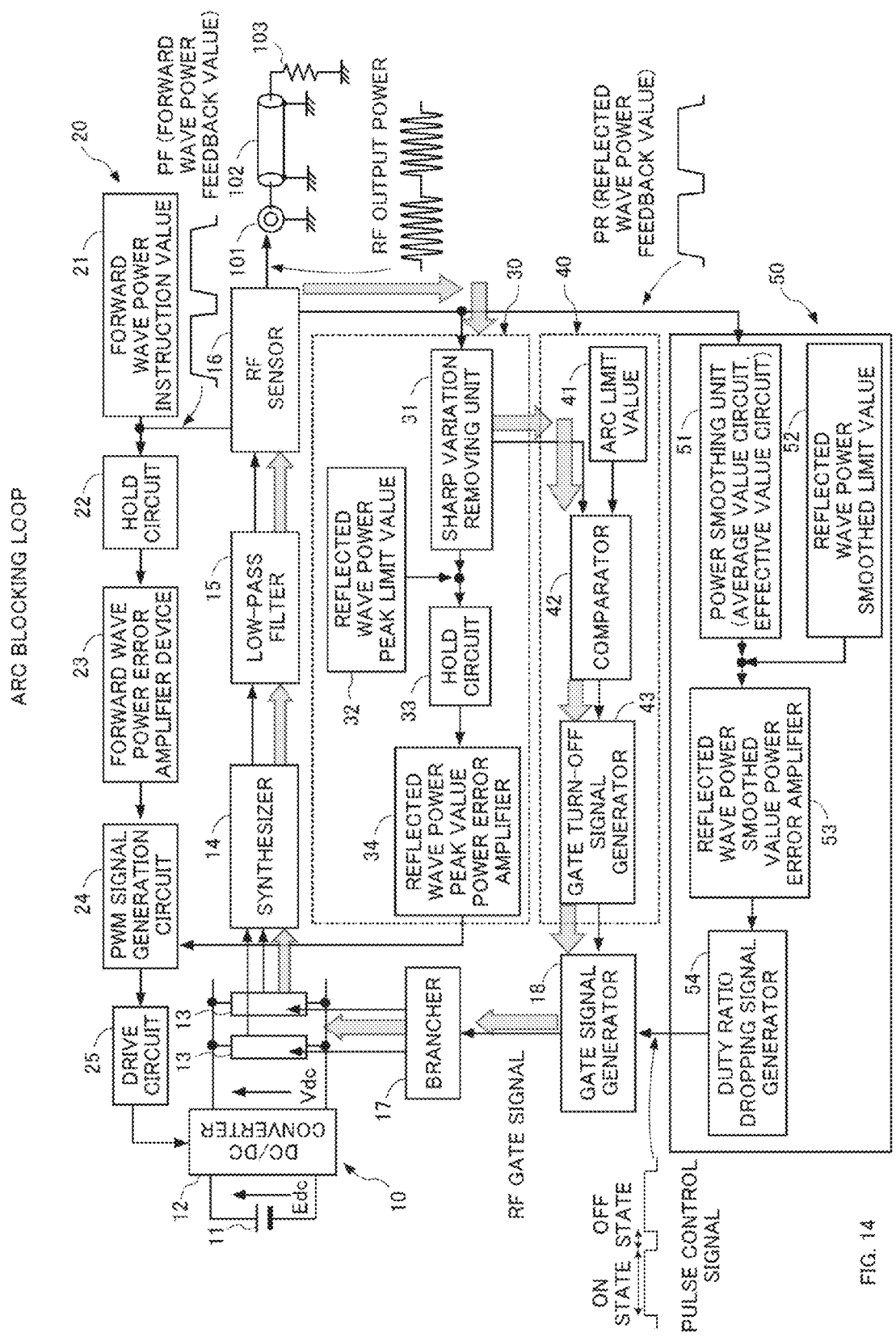
FIG. 14 is a diagram showing the operation of an arc blocking system of the present invention.

Next, the arc blocking control is described with reference to FIG. 14 to FIG. 16. FIG. 14 shows the arc blocking control loop system.

When reflected wave power increases due to a failure in the ignition of the plasma load and the reflected wave power feedback value PR exceeds the arc blocking level, the arc blocking system 40 shown in FIG. 14 (indicated by bold arrows in FIG. 14) performs the arc blocking operation.

When the peak value, from which a sharp variation is removed by the sharp variation removing unit 31, reaches the arc limit value 41, the gate turn-off signal generator 43 sends the blocking signal to stop the operation of the RF amplifier unit 13 for blocking an arc.

The pulse width of the RF output power during the arc blocking operation becomes much shorter than the pre-set pulse width used in the duty ratio during the normal pulse operation and, therefore, the RF power amplifier device is not destroyed.

When the ignition fails, high power is supplied immediately be fore arc blocking and, during this period, a high voltage is applied to the load. Therefore, the protection and the ignition retry can be accomplished at the same time. When the ignition succeeds, reflected wave power at normal pulse rise time can be reduced by removing a sharp variation. Therefore, an incorrect detection of ignition determination can be prevented and the pulse operation can be continued without interruption.

Figure 15:
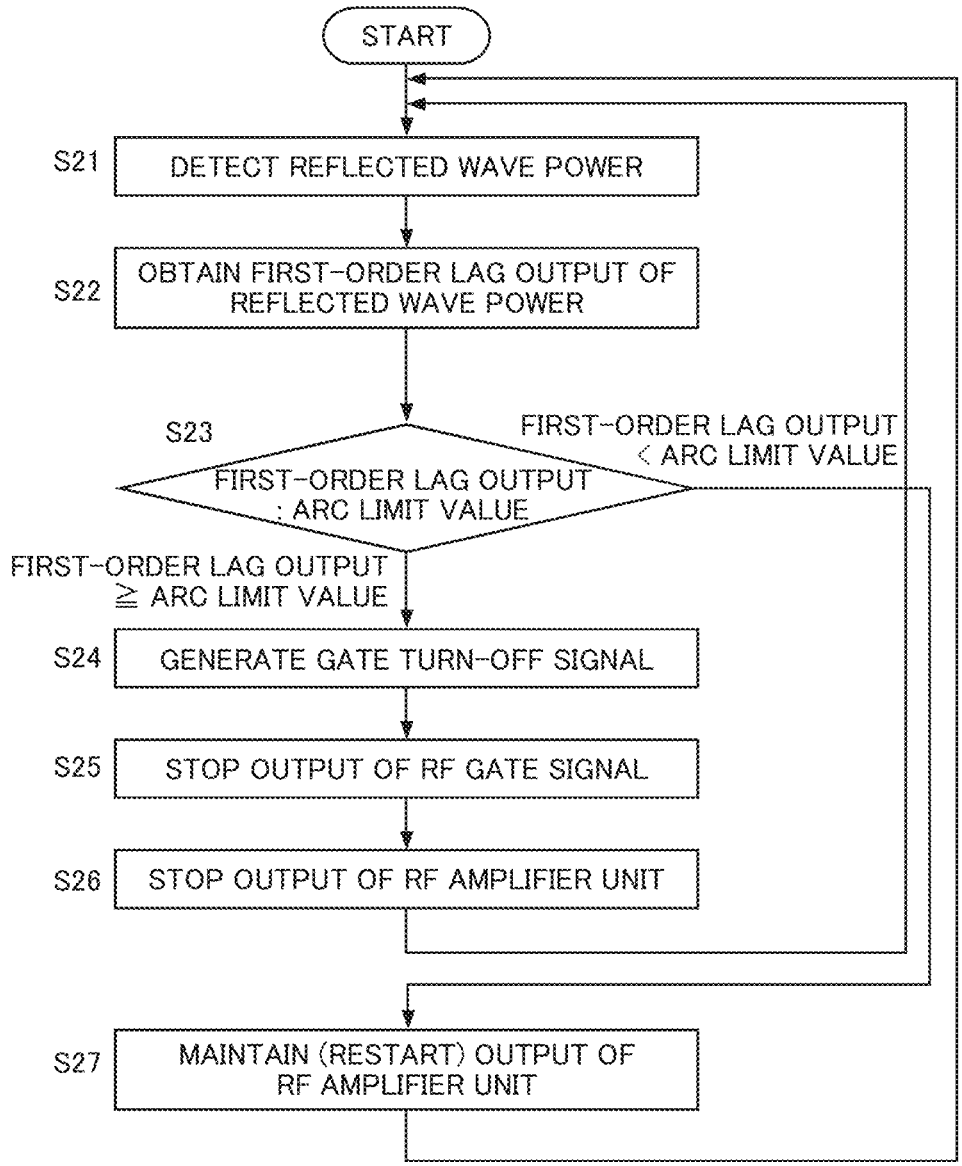
FIG. 15 is a flowchart showing the operation of the arc blocking system of the present invention.

In the flowchart in FIG. 15, the RF sensor 16 detects reflected wave power (S21) and sends the detected reflected wave power to the sharp variation removing unit 31 to remove a sharp variation. In the description below, an example is described in which the sharp variation removing unit outputs a first-order lag.

A sharp variation is removed by generating a first-order lag output of reflected wave power (S22). If the obtained first-order lag output exceeds the arc limit value 41 that is the arc blocking detection level (S23), the gate turn-off signal is generated (S24).

In response to the gate turn-off signal, the gate signal generator 18 stops the output of the RF gate signal (S25) to stop the output of the RF amplifier unit (S26).

On the other hand, if the first-order lag output does not exceed the arc limit value 41 (S23), the gate signal generator 18 generates the RF gate signal based on the predetermined duty ratio of the pulse control signal to maintain the output of the RF amplifier unit or, if the output of the RF amplifier unit is stopped, to restart the output (S27).

When the ignition fails, the ignition retry function may be used to perform the re-ignition operation. The re-ignition operation tries the ignition after a predetermined stop time elapses from the time the ignition is determined to fail. This retry function allows the operator to specify the number of retries to repeat the ignition operation or the time width of the stop time. The operator may also specify that, if the ignition does not succeed within a specified number of retries, the retry operation be stopped or the retry operation be once stopped and then restarted after a predetermined time.

Figure 16:
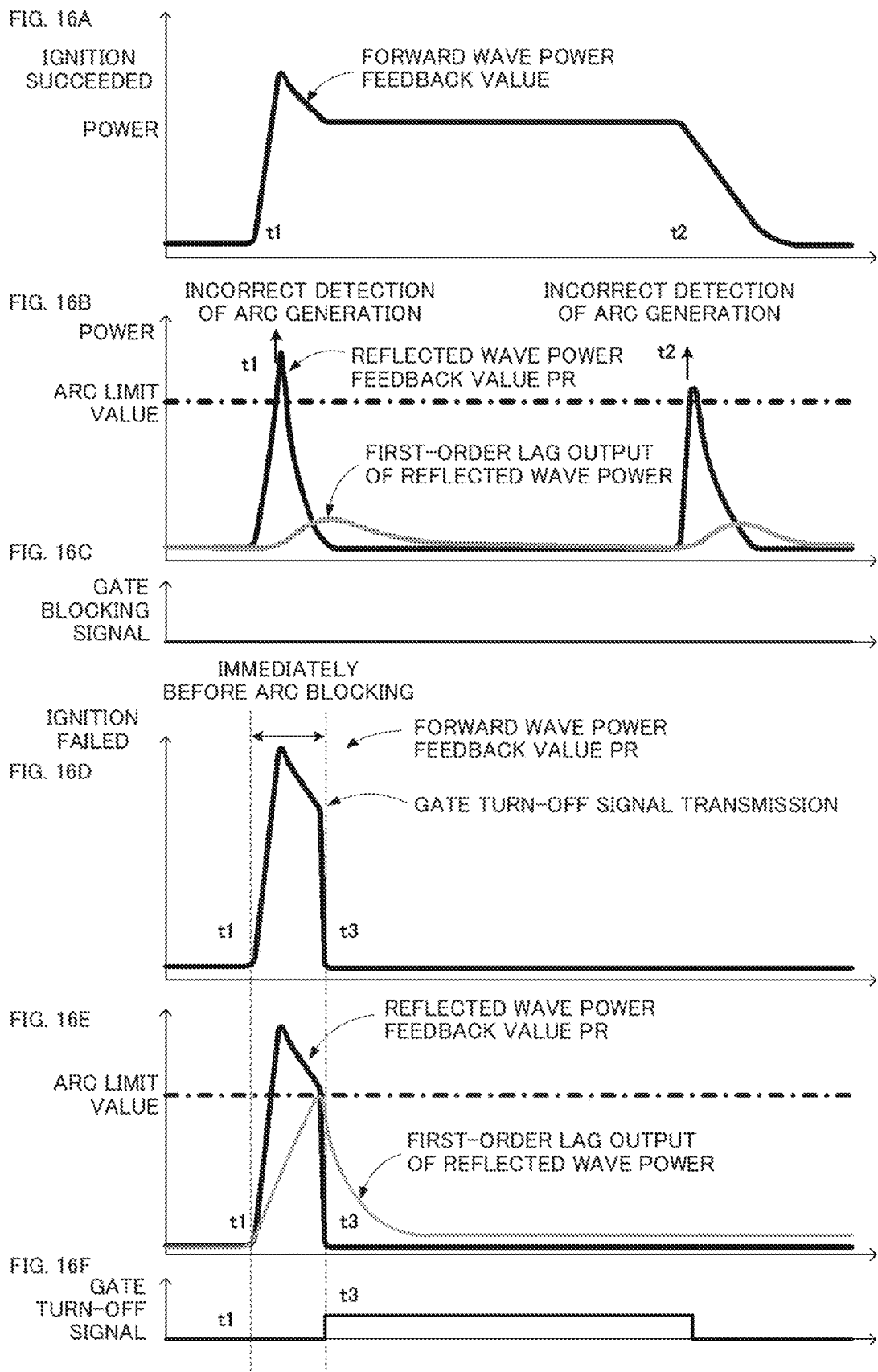
FIG. 16 is a diagram schematically showing the arc blocking operations when plasma ignition succeeded and failed.

FIG. 16 schematically shows the arc blocking operation when plasma ignition succeeded and when plasma ignition failed. The waveforms shown in FIG. 16 are not actual waveforms but are simplified for the sake of description. FIG. 16A and FIG. 16D show forward wave power feedback values. In FIGS. 16B and 16E, the bold solid line indicates the reflected wave power feedback value PR, the light solid line indicates the first-order lag output of the reflected wave power feedback value, and the chain line indicates the arc limit value.

FIGS. 16A to 16C show the waveform when the ignition succeeded, and FIGS. 16D to 16F show the waveform when the ignition failed.

When the ignition succeeded, the reflected wave power increases at the plasma rise time t1 and at the plasma fall time t2 (FIG. 16B). At this time, if the arc blocking operation is performed based on the reflected wave power feedback value PR (indicated by bold solid line), it is incorrectly determined that an abnormal condition, such as arc generation, is generated even when the normal ignition operation is performed, and the plasma is extinguished by the arc blocking operation.

On the other hand, the output generated by removing a sharp variation from the reflected wave power feedback value (first-order lag output (indicated by light solid line)) does not reach the arc limit value that is the arc blocking level and, therefore, the arc blocking operation is not performed. In this case, the gate turn-off signal is not output (FIG. 16C) and the forward wave power control is maintained.

When the ignition failed, the output generated by removing a sharp variation from the reflected wave power feedback value (first-order lag output (indicated by light solid line)) reaches the arc limit value, which is the arc blocking detection level, at the time t3, which is after the time t1, at ignition failure time (FIG. 16E). The gate turn-off signal is generated (FIG. 16F) and the arc blocking operation is started.

When the arc blocking operation is started and the arc is extinguished, the forward wave power feedback value PF and the reflected wave power feedback value PR are reduced (FIGS. 16D and 16E) and the first-order lag output of the reflected wave power attenuates according to the time constant of the first-order lag circuit (FIG. 16E).

(Reflected Wave Power Amount Dropping Control)

Figure 17:
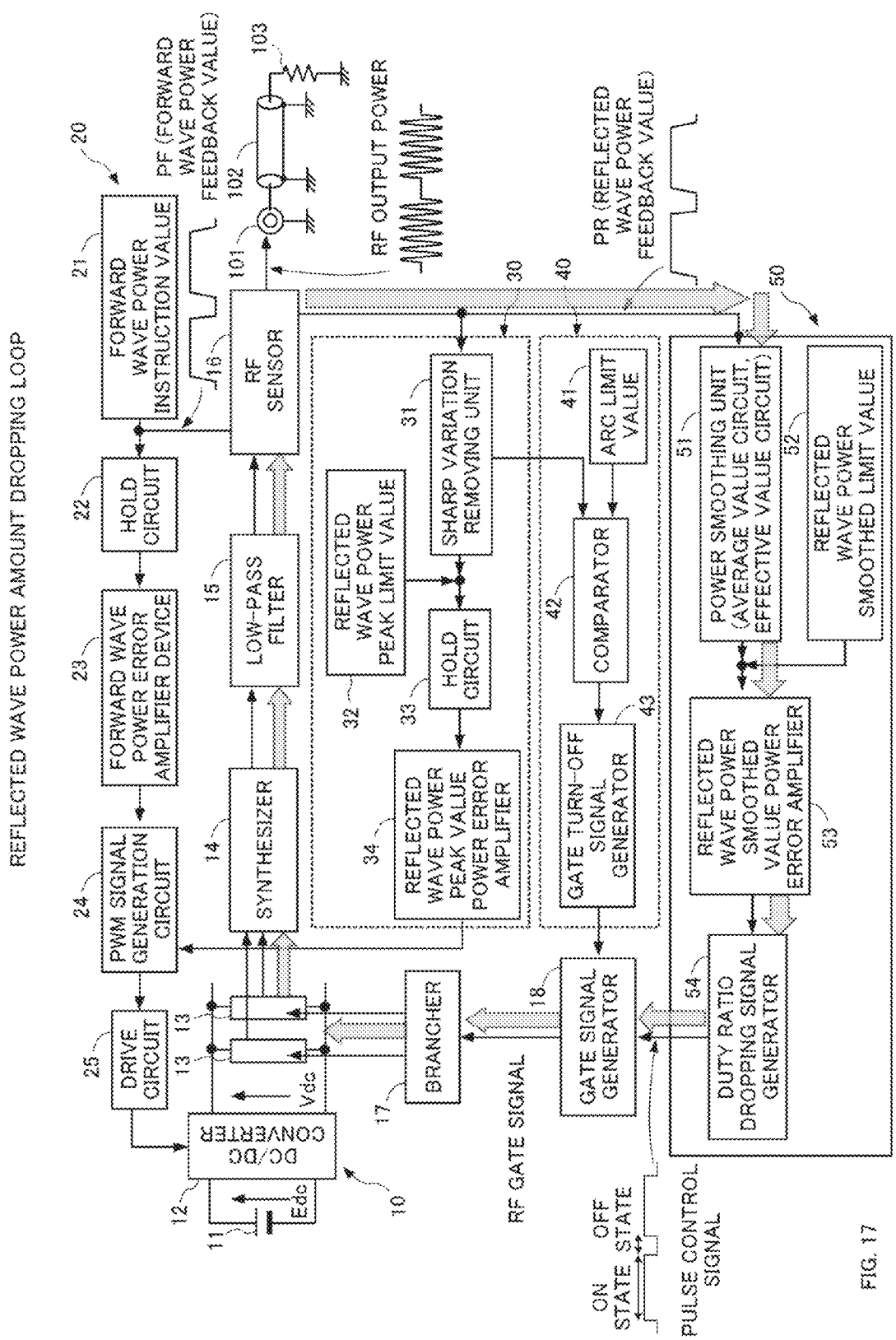
FIG. 17 is a diagram schematically showing the operation of the reflected wave power amount dropping loop system of the present invention.

Next, the reflected wave power amount dropping control is described with reference to FIG. 17 to FIG. 20. FIG. 17 schematically shows the reflected wave power amount dropping operation.

When the impedance of the load is not matched to 50 [ohm] and impedance matching is not achieved, reflected wave power is generated. If the reflected wave power smoothed value obtained by smoothing the reflected wave power feedback value PR, obtained by detecting the reflected wave power, exceeds the reflected wave power smoothed limit value 52, the reflected wave power amount dropping loop system 50 (indicated by bold arrows) shown in FIG. 17 performs the reflected wave power amount dropping operation. The reflected wave power smoothed value is the average value or the effective value of reflected wave power.

The reflected wave power dropping operation, performed under the reflected wave power amount dropping control, controls the duty ratio of the pulse control signal so that the output of the power smoothing unit 51 does not exceed the reflected wave power smoothed limit value 52. Limiting the width of the ON state of the RF gate signal in this manner prevents the power amount of RF output power from exceeding a predetermined value. By reducing the duty ratio of the pulse control signal, the reflected wave power amount dropping operation reduces the output power without reducing the amplitude of the PF output voltage and reduces a heat loss in the RF power amplifier device, thus preventing destruction.

When reflected wave power is reduced by the reflected wave power amount dropping operation and the output of the power smoothing unit 51 becomes smaller than the reflected wave power smoothed limit value 52, control returns to the forward wave power control again.

Figure 18:
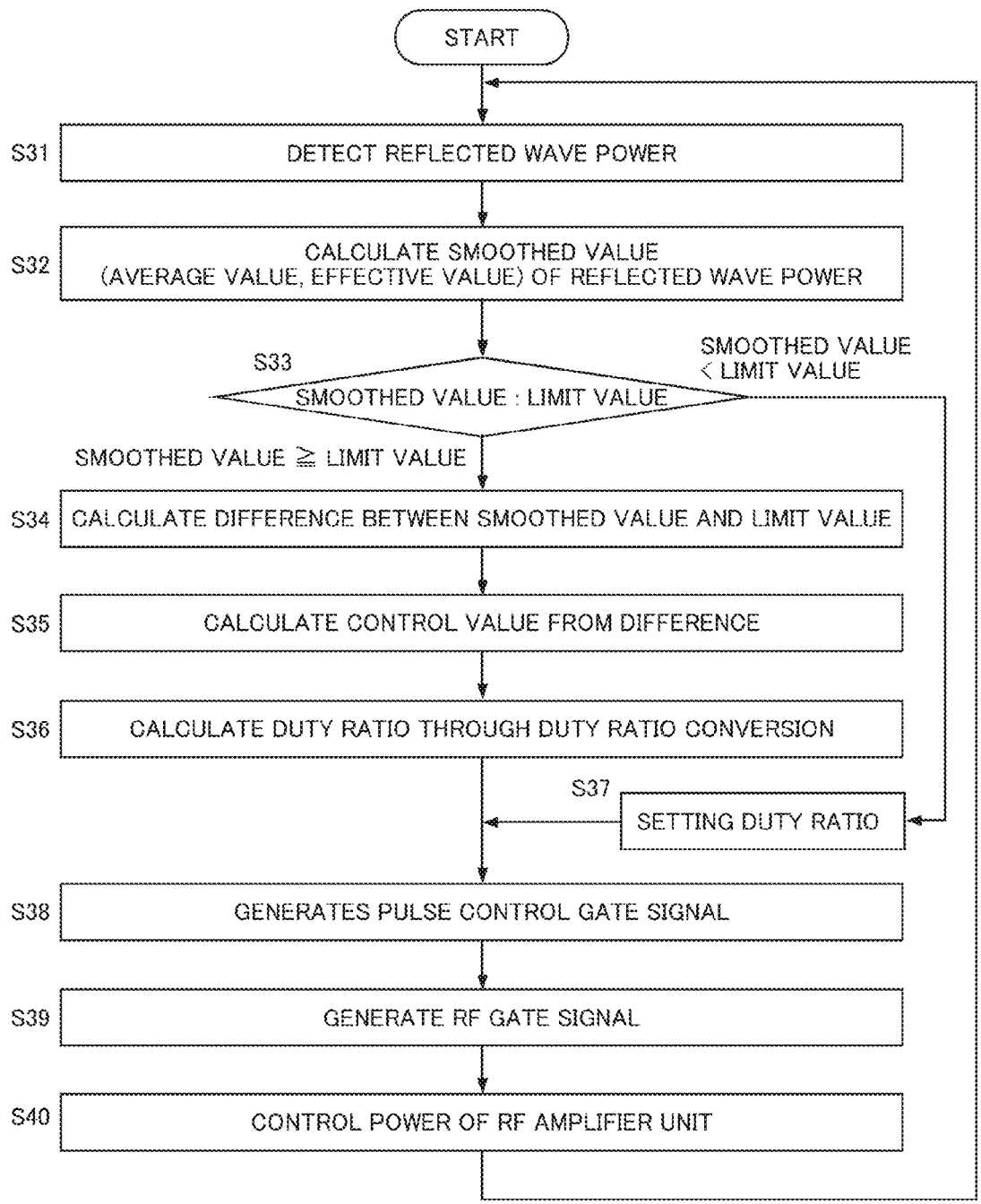
FIG. 18 is a flowchart showing the reflected wave power amount dropping loop system of the present invention.

In the flowchart shown in FIG. 18, the RF sensor 16 detects reflected wave power (S31) and sends the detected reflected wave power to the power smoothing unit 51 to calculate the reflected wave power smoothed value (S32). If the reflected wave power smoothed value exceeds the reflected wave power smoothed limit value 52 that is the reflected wave power detection level (S33), the difference between the reflected wave power smoothed value and the reflected wave power smoothed limit value 52 is calculated (S34). The control value is calculated based on this difference (S35), and the duty ratio of the pulse control signal corresponding to the control value is calculated through duty ratio conversion. To perform the duty ratio conversion, the relation between the control value and the duty ratio corresponding to this control value is predetermined and, based on this correspondence, the duty ratio is calculated from this control value.

Based on the calculated duty ratio, the duty ratio dropping signal generator 54 generates the duty ratio dropping signal. The gate signal generator 18 generates the RF gate signal, whose ON state is reduced, based on the duty ratio dropping signal. The duty ratio dropping signal is a pulse control signal that defines the duty ratio between the ON state and the OFF state of the RF gate signal. Reducing the ON state reduces the power amount of forward wave power and, thereby, reduces the power amount of reflected wave power (S38).

On the other hand, if the reflected wave power smoothed value does not exceed the reflected wave power smoothed limit value 52 (S33), the duty ratio dropping signal generator 54 does not generate the duty ratio dropping signal. The gate signal generator 18 generates the pulse control signal (S38) based on the predetermined setting duty ratio (S37), generates the RF gate signal based on the pulse control signal (S39), and drives the RF amplifier unit 13 by the generated RF gate signal to control the output power (S40).

FIG. 19 is a diagram showing the forward wave power control and the reflected wave power amount dropping operation. The horizontal axis of FIG. 19 indicates the time, and the vertical axis indicates the power (FIG. 19A) and the load voltage (FIG. 19B).

During the forward wave power control, the RF amplifier unit 13 is driven by the RF gate signal that has the ON state and the OFF state of the predetermined duty ratio. This driving increases the power of forward wave power (not shown) and, at the same time, increases the power amount of reflected wave power. When the reflected wave power smoothed value (average value or effective value), obtained by smoothing the reflected wave power, reaches the reflected wave power smoothed limit value, the reflected wave power amount dropping operation is started.

The reflected wave power amount dropping operation decreases the duty ratio of the pulse control signal to narrow the width of the ON state during which the RF gate signal is output. By doing so, the reflected wave power amount dropping operation controls the power amount of reflected wave power so that it does not exceed the reflected wave power smoothed limit value.

FIG. 19A shows an example in which the average value is used as the smoothed value. Through the reflected wave power average value dropping operation, the upper limit of the reflected wave power average value can be controlled so that it does not exceed the reflected wave power average limit value.

FIG. 19B, which shows the load voltage, indicates that the voltage applied to the load during the reflected wave power average value dropping operation is kept constant. The supplied power is reduced by reducing the number of cycles of RF voltages applied during one period of the pulse operation.

FIG. 20 schematically shows the reflected wave power amount dropping operation. The waveforms shown in FIG. 20 are not actual waveforms but are simplified for the sake of description.

Figure 20A:
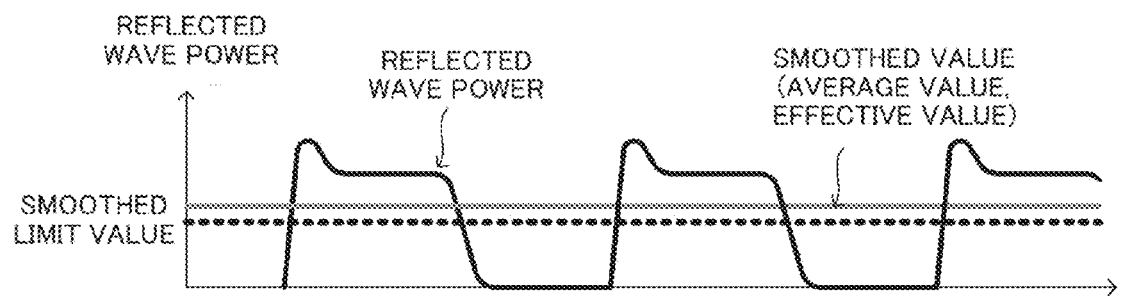
FIG. 20 is a diagram showing the reflected wave power amount dropping operation of the present invention.
Figure 20B:
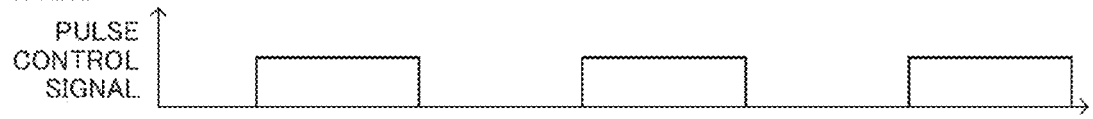
Figure 20C:
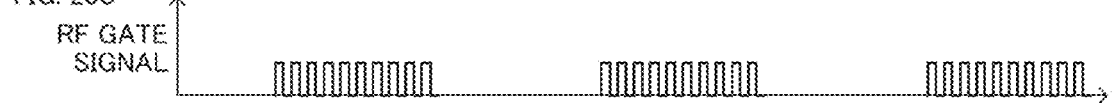
Figure 20D:
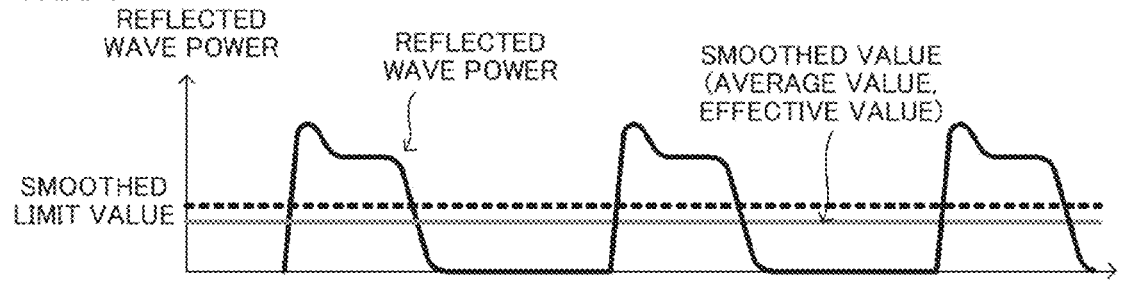
Figure 20E:
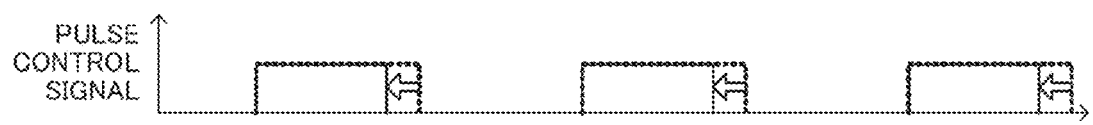
Figure 20F:
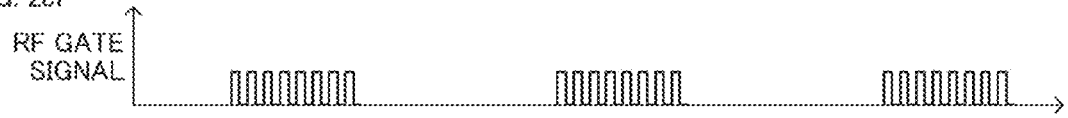

FIG. 20A to 20C show the case in which the reflected wave power smoothed value exceeds the reflected smoothed limit value, and FIG. 20D to 20F show a state after the reflected wave power amount dropping operation.

FIG. 20A shoes the reflected wave power and FIG. 20D shows the reflected wave power smoothed value. FIG. 20D, 20E show the pulse control signal, and FIG. 20C, 20F show a RF gate signal. The pulse control signal in the figures represent the ON state, in which the gate signal is output, and the OFF state in which the gate signal is not output. The signal waveforms are not actual waveforms but are simplified for the sake of description.

When RF signal (FIG. 20C) is generated based on the pulse control signal (FIG. 20B) determined by the pre-set duty ratio and the smoothed value average value or smoothed value of the reflected wave power exceeds the smoothed limit value (FIG. 20A) in FIG. 20A to FIG. 20C, the duty ratio of the pulse control signal is reduced and the reflected wave power amount is dropped FIG. 20D to FIG. 20F show a state after the reflected wave power amount dropping operation. The output power is controlled by that the duty ratio of the pulse control signal is reduced, and the pulse control signal (FIG. 20E) determined by the duty ratio is output. The RF signal is generated based on the pulse control signal (FIG. 20F) and the reflected wave power amount is dropped.

The following shows the table indicating the relation among the reflected wave power peak value dropping control, arc blocking control, and reflected wave power amount dropping control that are included in the reflected wave power control of the present invention.

TABLE 1

| | Control | | |
|---|---|---|---|
| | Reflected wave power amount dropping control | Reflected wave power peak value dropping control | Arc blocking control |
| Detection level | Low | Intermediate | High |
| Control value | Smoothed value of reflected wave power (average value, effective value) | Signal generated by removing sharp variation from reflected wave power (first-order lag) | Signal generated by removing sharp variation from reflected wave power (first-order lag) |
| Control target | RF output power Smoothed power amount of reflected wave power | RF output power Peak value of reflected wave power | RF output power Peak value of reflected wave power |
| Control target unit | RF power amplifier unit | DC/DC converter (voltage conversion unit) | RF power amplifier unit |
| Control amount | Duty ratio between ON state and OFF state of gate signal, Pulse control signal of class-D amplifier unit | PWM signal of DC/DC converter | Gate signal of class-D amplifier unit |
| Purpose | Prevention of thermal destruction of RF power amplifier device Maintenance of ignition voltage amplitude | Prevention of destruction of RF power amplifier device due to surge voltage | RF generator protection |

The description of the embodiments and modifications described above are an example of the RF power supplying device and the reflected wave power control method of the present invention. It is to be understood that the present invention is not limited to the embodiments but may be modified in various ways based on the spirit of the present invention and that those modifications are included in the scope of the present invention.

INDUSTRIAL APPLICABILITY

The RF power supplying device and the reflected wave power control method of the present invention are applicable to a power supply that supplies power to a plasma generation device.

DESCRIPTION OF REFERENCE NUMERALS

1 RF power supplying device
10 RF generator unit
11 DC power supply
12 Converter
13 Amplifier unit
14 Synthesizer
15 Low-pass filter
16 Sensor
17 Brancher
18 Gate signal generator
20 Forward wave power control loop system
21 Forward wave power instruction value
22 Hold circuit
23 Forward wave power error amplifier device
24 PWM signal generation circuit
25 Drive circuit
30 Reflected wave power peak value dropping loop system
31 Sharp variation removing unit
32 Reflected wave power peak limit value
33 Hold circuit
34 Reflected wave power peak value power error amplifier
40 Arc blocking system
41 Arc limit value
42 Comparator
43 Gate turn-off signal generator
50 Reflected wave power amount dropping loop system
51 Power smoothing unit
52 Reflected wave power smoothed limit value
53 Reflected wave power smoothed value power error amplifier device
54 Duty ratio dropping signal generator
60 Circuit
61 Hold circuit
62 Error amplifier circuit
63 Resistor
64 Resistor
65 Switch circuit
66 Operational amplifier
70 Circuit
71 Hold circuit
72 Error amplifier circuit
73 Resistor
74 Resistor
75 Switch circuit
76 Operational amplifier
77 Buffer circuit
80 First-order lag circuit
81 Resistor
82 Capacitor
90 Filter circuit
91 Differentiation circuit
92 Comparator circuit
93 Limit value
94 Delay circuit
95 Switching circuit
100 Reflected wave power control loop system
101 Generator output end
102 Coaxial cable
103 Load
120 Amplifier unit
120a-120d MOSFET
120e Main transformer
120f Filter
202 First-order lag output
203 Smoothed value
301 Limit value
302 Reflected wave power peak limit value
303 Arc limit value
Edc DC voltage
PF Forward wave power feedback value
PR Reflected wave power feedback value
Vdc DC voltage

The invention claimed is:

1. An RF power supplying device that supplies RF power to a plasma load, said RF power supplying device comprising:
an RF generator unit that converts DC of a DC power supply to RF AC through a switching operation and outputs RF power; and
a feedback system that feeds back a detection value of the RF output of said RF generator unit for performing feedback control, wherein
said feedback system comprises:
a forward wave power control loop system that feeds back a detection value of forward wave power, which is sent from said RF generator unit to a plasma load, for controlling the forward wave power; and
a plurality of reflected wave power control loop systems each of which feeds back a detection value of reflected wave power, which is sent from said plasma load to said RF generator unit, for controlling the reflected wave power,
said reflected wave power control loop system comprising:
a reflected wave power peak value dropping loop system and an arc blocking system that control a peak variation in reflected wave power and a reflected wave power amount dropping loop system that controls a smoothed power amount of reflected wave power, wherein
said reflected wave power peak value dropping loop system controls a DC voltage of the DC power supply of said RF generator unit based on a peak value of reflected wave power and, through the voltage control of the DC power supply, controls whether to drop the peak value of reflected wave power,
said arc blocking system controls whether to output from an RF amplifier unit of said RF generator unit, based on the peak value of reflected wave power, to control whether to supply power to the plasma load and thereby controls arc blocking at the plasma load, and
said reflected wave power amount dropping loop system controls a duty ratio (time ratio) between an ON state and an OFF state of the RF amplifier unit of said RF generator unit, based on a smoothed power amount of reflected wave power, to control a supply amount of power to the plasma load and thereby controls dropping of a power amount of reflected wave power.

2. The RF power supplying device according to claim 1, wherein
said reflected wave power peak value dropping loop system comprises a reflected wave power peak limit value as a threshold for determining whether peak value dropping control of reflected wave power is to be performed, and a difference between the detection value of reflected wave power and the reflected wave power peak limit value is fed back to said forward wave power control loop system to control a pulse width of a PWM signal, which drives a DC/DC converter provided in said RF generator unit, for controlling the DC voltage of the DC power supply.

3. The RF power supplying device according to claim 1, wherein said ark blocking system comprises an arc limit value as a threshold for determining whether RF power is to be output, and an RF gate signal is controlled based on a comparison between the detection value of reflected wave power and the arc limit value for controlling whether RF power of the RF amplifier unit is to be output, the RF gate signal controlling the RF amplifier unit provided in said RF generator unit.

4. The RF power supplying device according to claim 1, wherein said reflected wave power amount dropping loop system comprises:

a power smoothing unit that outputs an average value or an effective value of the detection values of reflected wave power; and a reflected wave power average limit value or a reflected wave power effective limit value as a reflected wave power dropping limit value that defines whether to drop a power amount of RF power as well as a dropping amount, wherein based on a comparison between an average value output of said power smoothing unit and the reflected wave power average limit value or a comparison between an effective value output of said power smoothing unit and the reflected wave power effective limit value, a duty ratio (time ratio between an ON state and an OFF state of the RF amplifier unit) of a pulse control signal is determined for controlling a power amount dropping of RF power of the RF amplifier unit, the pulse control signal controlling the RF amplifier unit provided in said RF generator unit.

5. The RF power supplying device according to one of claims 1 to 3 wherein at least one of said reflected wave power peak value dropping loop system and said arc blocking system comprises a sharp variation removing unit that removes a sharp variation from the detection value of reflected wave power, wherein said sharp variation removing unit removes a sharp variation amount, generated by a sharp variation, from the detection value of reflected wave power and feeds back a signal corresponding to a peak value of reflected wave power not generated by the sharp variation.

6. The RF power supplying device according to claim 5 wherein said sharp variation removing unit is a first-order lag circuit that causes a first-order lag in the detection values of reflected wave power.

7. A reflected wave power control method for an RF power supply that supplies RF power to a plasma load, said RF power supply comprising:

an RF generator unit that converts DC of a DC power supply to RF AC through a switching operation and outputs RF power; and a feedback system that feeds back a detection value of the RF output of said RF generator unit for performing feedback control, wherein said feedback system comprises:

a forward wave power control loop system that feeds back a detection value of forward wave power, which is sent from said RF generator unit to a plasma load, for controlling the forward wave power; and a plurality of reflected wave power control loop systems each of which feeds back a detection value of reflected wave power, which is sent from said plasma load to said RF generator unit, for controlling the reflected wave power, said reflected wave power control loop system comprising:

a reflected wave power peak value dropping loop system and an arc blocking system that control a peak variation in reflected wave power; and a reflected wave power amount dropping loop system that controls a smoothed power amount of reflected wave power, wherein said reflected wave power peak value dropping loop system controls a DC voltage of the DC power supply of said RF generator unit based on a peak value of reflected wave power and, through the voltage control of the DC power supply, controls whether to drop the peak value of reflected wave power, said arc blocking system controls whether to output from an RF amplifier unit of said RF generator unit, based on the peak value of reflected wave power, to control whether to supply power to the plasma load and thereby controls arc blocking at the plasma load, and said reflected wave power amount dropping loop system controls a duty ratio (time ratio) between an ON state and an OFF state of the RF amplifier unit of said RF generator unit, based on a smoothed power amount of reflected wave power, to control a supply amount of power to the plasma load and thereby controls dropping of a power amount of reflected wave power.

8. The reflected wave power control method according to claim 7, wherein said reflected wave power peak value dropping loop system comprises a reflected wave power peak limit value as a threshold for determining whether peak value dropping control of reflected wave power is to be performed, and a difference between the detection value of reflected wave power and the reflected wave power peak limit value is fed back to said forward wave power control loop system to control a pulse width of a PWM signal, which drives a DC/DC converter provided in said RF generator unit, for controlling the DC voltage of the DC power supply.

9. The reflected wave power control method according to claim 7, wherein said ark blocking system comprises an arc limit value as a threshold for determining whether RF power is to be output, and an RF gate signal is controlled based on a comparison between the detection value of reflected wave power and the arc limit value for controlling whether RF power of the RF amplifier unit is to be output, the RF gate signal controlling the RF amplifier unit provided in said RF generator unit.

10. The reflected wave power control method according to claim 7, wherein said reflected wave power amount dropping loop system comprises:

a power smoothing unit that outputs an average value or an effective value of the detection values of reflected wave power; and a reflected wave power average limit value or a reflected wave power effective limit value as a reflected wave power dropping limit value that defines whether to drop a power amount of RF power as well as a dropping amount, wherein based on a comparison between an average value output of said power smoothing unit and the reflected wave power average limit value or a comparison between an effective value output of said power smoothing unit and the reflected wave power effective limit value, a duty ratio (time ratio between an ON state and an OFF state of the RF amplifier unit) of a pulse control signal is determined for controlling a power amount dropping of RF power of the RF amplifier unit, the pulse control signal controlling the RF amplifier unit provided in said RF generator unit.

11. The reflected wave power control method according to one of claims 7 to 9 wherein at least one of said reflected wave power peak value dropping loop system and said arc blocking system comprises a sharp variation removing unit that removes a sharp variation from the detection value of reflected wave power, wherein said sharp variation removing unit removes a sharp variation amount, generated by a sharp variation, from the detection value of reflected wave power and feeds back a signal corresponding to a peak value of reflected wave power not generated by the sharp variation.

12. The reflected wave power control method according to claim 11 wherein said sharp variation removing unit removes the sharp variation, generated by a sharp variation, from the detection value of reflected wave power by causing a first-order lag in the detection value of reflected wave power.

* * * * *